United States Patent [19]

Iwamatsu

[11] Patent Number: 5,400,366
[45] Date of Patent: Mar. 21, 1995

[54] QUASI-SYNCHRONOUS DETECTION AND DEMODULATION CIRCUIT AND FREQUENCY DISCRIMINATOR USED FOR THE SAME

[75] Inventor: Takanori Iwamatsu, Kawasaki, Japan

[73] Assignee: Fujitsu Limited, Kanagawa, Japan

[21] Appl. No.: 89,786

[22] Filed: Jul. 9, 1993

[30] Foreign Application Priority Data

Jul. 9, 1992 [JP] Japan .................................. 4-182182
Jul. 29, 1992 [JP] Japan .................................. 4-202555

[51] Int. Cl.$^6$ ...................... H04L 27/06; H04L 5/12; H04L 27/08; H03D 1/00
[52] U.S. Cl. ........................................ 375/97; 375/39; 375/94; 375/98
[58] Field of Search ................ 329/304, 306, 307, 345, 329/346; 375/39, 80, 94, 97, 98

[56] References Cited

U.S. PATENT DOCUMENTS

| | | | |
|---|---|---|---|
| 5,012,491 | 4/1991 | Iwasaki | 375/96 |
| 5,107,522 | 4/1992 | Kitayama | 375/97 |
| 5,311,545 | 5/1994 | Critchlow | 375/14 |

Primary Examiner—Edward L. Coles, Sr.
Assistant Examiner—John Ning

[57] ABSTRACT

The present invention relates to a quasi-synchronous detection and demodulation circuit with a contingent demodulation carrier phase removing function and to a frequency discriminator used in the above circuit and for detecting with a good accuracy the difference between the carrier frequency of a modulated wave and a reference carrier frequency for demodulation. In order to detect a normal frame pattern by a frame pattern detecting means, the quasi-synchronous detection and demodulation circuit compensates an output carrier phase issued from a carrier generating means to add to a phase rotation means and removes a contingent demodulated carrier phase. The frequency discriminator limits a frequency deviation to less than an upper value according to the accuracy of a reference carrier signal.

7 Claims, 22 Drawing Sheets

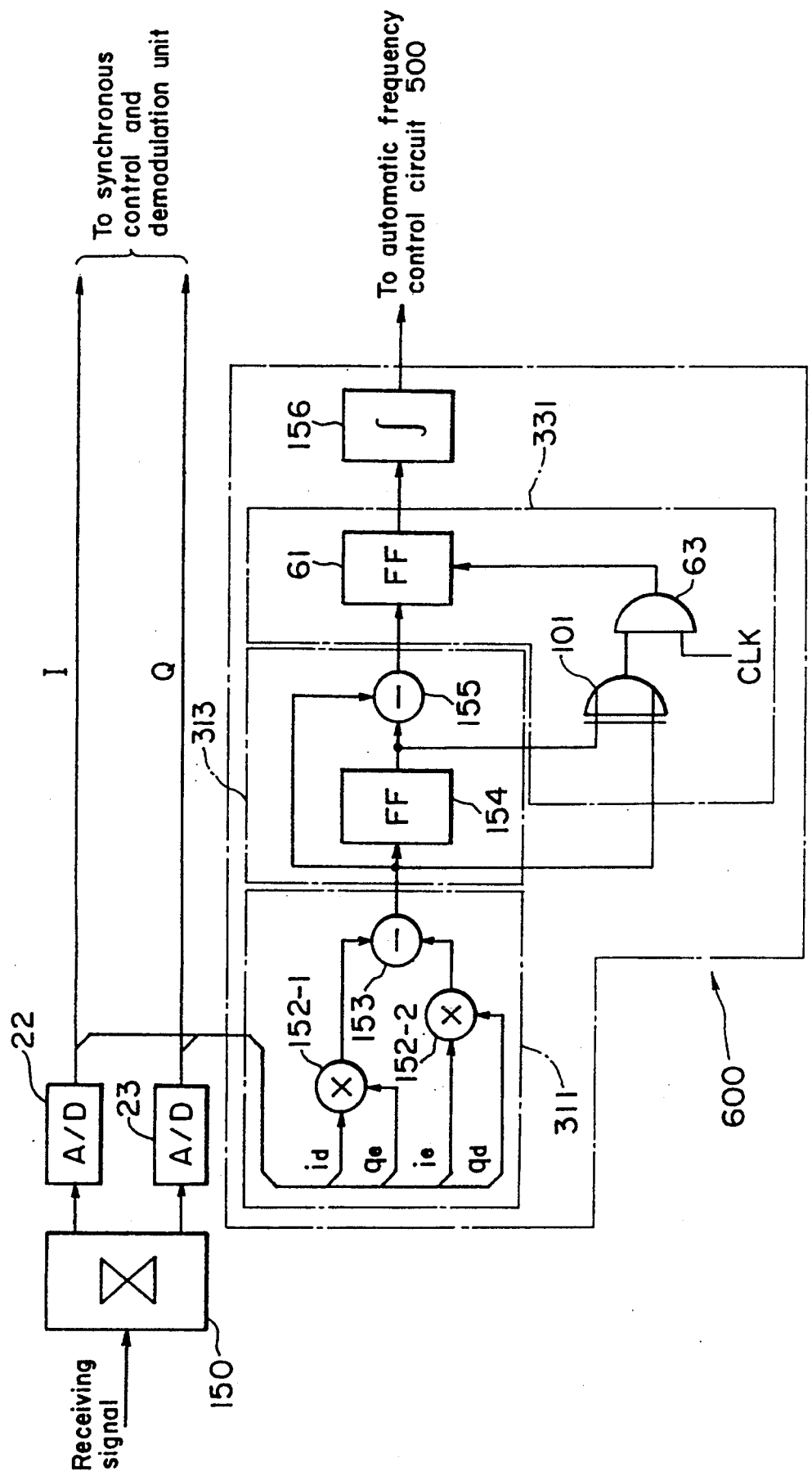

QUASI-SYNCHRONOUS DETECTION AND DEMODULATION CIRCUIT AND FREQUENCY DISCRIMINATOR USED FOR THE SAME

BACKGROUND OF THE INVENTION

1. Field of the Invention

The present invention relates to a quasi-synchronous detection and demodulation circuit for demodulating a quadrature amplitude modulation (QAM) signal, and more particularly to a quasi-synchronous detection and demodulation circuit having a contingent demodulation carrier phase removing function and a frequency discriminator used for the same and for detecting the difference between the carrier wave frequency of a modulating wave and a reference carrier wave frequency for demodulation.

2. Description of the Related Art

In the quasi-synchronous detection and demodulation system, when a quadrature modulated wave is demodulated, a demodulation signal can be obtained by a phase rotation process where a signal demodulated with a local signal of a fixed frequency is subjected to a digital carrier reproduction (DCR).

(a) Explanation of synchronous detection and demodulation system

First, an explanation will be made below as for a synchronous detection and demodulation system.

FIG. 17 shows a conventional demodulation circuit and its synchronous detection operation. Referring to FIG. 17, numeral 11 represents a hybrid (H), 12 and 13 represent a detecting circuit, respectively, 14 represents a voltage controlled oscillator (VCO), 15 represents a 90-degree hybrid (H), 16 and 17 represent a low pass filter, respectively, 18 and 19 represent a variable gain amplifier, 20 and 21 represent an adder, respectively, 22 and 23 represent an analog to digital converter (A/D converter), respectively, 24 represents an equalizer, 25 represents a control unit (CONT), and 26, 27, 28, 29, and 30 represent a low pass filter, respectively.

In the synchronous detection and demodulation system, the intermediate frequency signal (IF IN) subjected to a quadrature modulation (QAM) is branched in two by the hybrid 11 to input respectively to one inputs of the detecting circuits 12 and 13. The voltage controlled oscillator 14 constructs a carrier reproducing circuit (CR) and reproduces a clock synchronized with an input signal. The 90-degree hybrid 15 shifts the local signal by 90° and applies it to the other inputs of the detecting means 12 and 13. The detecting circuit 12 produces an I-channel demodulation output and the detecting circuit 13 produces a Q-channel demodulation output.

The I-channel demodulation output is subjected to a band limit in the low pass filter 16 and then to an automatic gain control (AGC) of a signal amplitude in the variable gain amplifier 18. The Q-channel demodulation output is subjected to a band limit in the low pass filter 17 and then to an automatic gain control (AGC) of a signal amplitude in the variable gain amplifier 19. Furthermore, the I-channel output is subjected to a drift control (DRC) in the adder 20 to compensate the shift of a direct current component and converted into, for example, an 8-bit digital signal by the A/D converter 22. The Q-channel output is subjected to a drift control (DRC) in the adder 21 to compensate the shift of a direct current component and converted into, for example, an 8-bit digital signal by the A/D converter 23. The equalizer 24 such as a transversal equalizer or the similar circuits performs an desired amplitude equalization of the two signals and produces the output data Ich and Qch.

The control unit 25 produces frequency control signals for the VCO 14 from the demodulated data Ich and Qch. In the control signals, when the first bit of the demodulated data indicates a polarity signal (D), bits in a predetermined number less than the second bit thereof indicate an effective data, and the 1-bit less than the effective data indicates an error signal (E), the exclusive-OR of $D_{(I)}$ and $E_{(Q)}$ or the exclusive-OR of $D_{(Q)}$ and $E_{(I)}$ are used as data where the I-channel data and the Q-channel signal are respectively represented with a subscript I and a subscript Q. For example, in the 16 QAM system, the second and third bits represent an effective data and the fourth bit represents an error signal. The signal is smoothed by the low pass filter 26 and then is sent as a control voltage to the VCO 14. The VCO 14 varies its oscillation frequency and is controlled so as to synchronize with the frequency of the input signal.

The control unit 25 produces an AGC control signal from demodulation data Ich and Qch. In this case, an exclusive-OR data of $D_{(I)}$ and $E_{(I)}$ is used as a control signal for the I-channel. An exclusive-OR data of $D_{(Q)}$ and $E_{(Q)}$ is used as a control signal for the Q-channel. These signals are respectively supplied to the variable gain amplifiers 18 and 19 via the low pass filters 27 and 28 to perform a base band (B,B) AGC controlling the amplitude of the demodulation signal of each of the channels.

Furthermore, the control unit 25 produces DRC control signals from the demodulation data $I_{CH}$ and $Q_{CH}$. $E_{(I)}$ data is used as a control signal for the I-channel and $E_{(Q)}$ data is used as a control signal for the Q-channel. One control signal is smoothed by the low pass filters 29 and supplied to the adder 20 to compensate the direct current component of the demodulation data in the I-channel. The other control signal is smoothed by the low pass filters 30 and supplied to the adder 21 to compensate the direct current component of the demodulation data in the Q-channel.

(b) Explanation of quasi-synchronous detection and demodulation system

FIG. 18 shows a quasi-synchronous detection and demodulation circuit having the configuration that a fixed frequency oscillator, a phase rotation unit, and a digital variable frequency oscillator are added to the synchronous detection and demodulation in FIG. 17, but the carrier reproduction unit thereof is omitted. In FIG. 18, like numerals represent the similar elements to those in FIG. 17. Numeral 31 represents a fixed frequency oscillator (OSC), 32 represents a phase rotation unit, and 33 represents a low pass filter, and 34 represents a digital variable frequency oscillator (DVCO).

FIG. 19 shows the configuration of the phase rotation unit 32. Numerals 36, 37, 38, and 39 are a mixer, respectively, and 40 and 41 are an adder, respectively. In FIG. 19, it is assumed that when I and Q represent the signals before a phase rotating process and I' and Q' represent the signals after the phase rotating process, a phase rotation to be desired is $\ominus$. By inputs of $\cosine(\theta)$, $\sine(\theta)$, $\sine(\theta)$, and $\cosine(\theta)$ signals to the mixers 36, 37, 38, and 39, respectively, a desired phase rotation $\theta$ can be obtained by the following expressions:

$$I' = I \cosine(\theta) - Q \sine(\theta) \quad (1)$$

$$Q' = I \sine(\theta) + Q \cosine(\theta) \quad (2)$$

FIG. 20 shows the configuration of the DVCO 34. Numerals 43 and 44 represent a delay circuit, respectively, 45 represents an adder, and 46 and 47 are a read-only memory (ROM), respectively.

The control unit 25, like that shown in FIG. 17, produces a frequency control signal from the demodulation data $I_{CH}$ and $Q_{CH}$. The control signal is smoothed by the low pass filter 33 and then is added to the delay circuit 43 to hold for a predetermined space of time. Then the accumulator (integrator VCO) formed of a delay circuit 44 and an adder 45 counts up or down the delayed control signal every sampling period and adds the output as an address to the ROMs 46 and 47. The address corresponds to the phase angle $\theta$ in the phase rotation unit 32. The ROMs 46 and 47 output the sine ($\theta$) and cosine($\theta$) data corresponding to the address, respectively.

FIG. 21 shows a rough configuration on the modulation side. Numerals 48 and 49 represent a digital to analog converter (D/A converter), respectively, 50 and 51 represent a low pass filter, respectively, 52 and 53 represent a mixer, respectively, 54 represents a hybrid, 55 represents a carrier oscillator (OSC), and 56 represents a 90-degree hybrid.

In the above circuit structure, the I-channel input signal is converted to an analog signal from a digital signal by means of the D/A converter 48, band-limited by the low pass filter 50, and then inputs to the mixer 52 while the Q-channel input signal is converted to an analog signal from a digital signal by means of the D/A converter 49, band-limited by the low pass filter 51, and then inputs to the mixer 53. Since the 90-degree hybrid 56 supplies in an quadrature phase a local signal with a constant frequency of the OSC 55 to the other inputs of the mixers 52 and 53, the hybrid 54 synthesizes the outputs from the mixers 52 and 53 to produce a quadrature modulation wave.

(c) Explanation of phase contingent

Generally in order to transmit the digital signal to a distant place, the carrier modulating and transmitting method has been utilized. Moreover, since the frequency band where digital signals are transmitted can be used effectively, the QAM modulation system has been widely used as described above. The demodulation of the QAM signal requires adding a carrier synchronized with the carrier of the received QAM signal so that a carrier reproducing circuit is used to reproduce the carrier.

The carrier of the received QAM signal includes four kinds of phases of 0, $\pi/2$, $\pi$, and $3\pi/2$. However, since it cannot be decided that what kind of phase a received QAM signal has, a carrier reproducing circuit for the QAM signal reproduces a carrier which synchronizes with one of the four kinds of phases.

When the difference between the phase of a carrier reproduced by a carrier reproducing circuit and the phase of a carrier of the received QAM signal is zero, the demodulation digital signal coincides with the original input digital signal. However, when there is a phase difference, the input does not coincide with the digital signal of the demodulation output. For that reason, a signal which is obtained by executing a differential logic with a signal preceding by one symbol of the transmitted input signal is transmitted and an original digital signal which is obtained by executing a differential releasing logic with a signal preceding by one symbol of the demodulated output signal is obtained.

As described above, the QAM digital signal is transmitted by subjecting an input digital signal to a differential logical operation. Hence, a logic circuit for performing the complicated differential logical and differential releasing operation is required. When the QAM modulated digital signal is transmitted after its differential logical operation, one-bit error of the transmitted signal appears as two-bit error at the differential logical releasing operation, whereby the bit error rate becomes worse.

(d) Explanation of frequency discriminator

As described above, in the recent digital radio transmission system, a multi-level transmission system employing a quadrature amplitude modulation has been widely used since having advantages in an effective use of radio frequency and others. In such a modulation system, the number of the multi-level is increasing with an increasing transmission capacity and a request for the improved performance. The increasing multi-level number requires the higher accuracy of the signal layout on a modulation wave signal space diagram (hereinafter merely abbreviated to "signal space"). The lower accuracy may lead to, for example, drift, pseudo absorption, or other troubles at the demodulation time.

In order avoid such troubles and to construct a stable transmission system, it is necessary to perform a transmission distortion compensation, a drift compensation of a discrimination circuit, fading equalizing, interference noise compensation, and other techniques. These techniques can be realized when the frequency of a reference carrier signal Used for a demodulation operation coincides in higher accuracy with the carrier frequency of a modulation wave (received wave). Generally the receiving device includes an automatic frequency control circuit which controls sequentially and variably the frequency of a reference carrier signal to a proper value to absorb the difference within a fixed accuracy. The automatic frequency control circuit includes a frequency discriminator for providing the above control criteria.

FIG. 22 is a diagram showing a constructional example of a conventional frequency discriminator of this kind. In the figure, the quadrature detector 150 receives a receiving signal converted with a predetermined intermediate frequency and produces two quadrature base band signals I and Q to input to the A/D converters 22 and 23, respectively. The output of the A/D converter 22 is separated in two to connect to the multiplicand inputs of the multipliers 152-1 and 152-2. The output of the A/D converter 23 is separated in two to connect to the multiplicand inputs of the multipliers 152-1 and 152-2. The output of the multiplier 152-1 is connected to the minuend inputs of the subtractor 153. The output of the multiplier 152-2 is connected to the subtrahend inputs of the subtractor 153. The Output of the subtractor 153 is connected to the input of the latch circuit (FF) 154 and the subtrahend input of the subtractor 155. The output of the latch circuit 154 is connected to the minuend input of the subtractor 155. The output of the subtractor 155 is connected to the control input of an automatic frequency control circuit (AFC) by way of the integrator 156 arranged at the rear stage.

In the frequency discriminator structure, the receiving signal is subjected to a 4-phase PSK modulation in accordance with an transmitted information . As shown in FIG. 23, on the time axis calibrated by clocks synchronized with each bit of the transmission information, it is assumed that a demodulated signal (hereinafter referred to "symbol") of a received wave at the time $t_n$ is at the signal point $r_n$ shown by the coordinate $(i(t_n),q(t_n))$ in the signal space and the normal position of the signal point is at the signal point R1 shown by the coordinates $(i_0(t_n),q_0(t))$ in the signal space. Generally, with respect to the polarities $i_d(t_n)$ and $qd(i_n)$ corresponding to the axes I and Q in a error signal space shown in the difference between the coordinates, the phase difference $\Delta\Theta(tn)$ between the a received signal and a reference carrier signal used at a demodulation time is held by the following expression:

$$\Delta\Theta(tn) \approx i_d(t_n) \times (q(t_n) - q_0(t_n)) - (i(t_n) - i_0(t_n)) \times q_d(t_n) \approx \quad (1\text{-}1)$$

$$i_d(t_n) \times q_e(t_n) - i_e(t_n) \times q_d(t_n)$$

Furthermore, with respect to the time $t_{n-1}$ defined on the basis of the clock preceding by the time $t_n$ on the time axis, the frequency component $\Delta f$ of the error is held by the following expression:

$$\Delta f(t_n) = \Delta\Theta(t_n) - \Delta\Theta(t_{n-1}) \quad (1\text{-}2)$$

The multiplier 152-1 calculates every clock periods the value of the first term of the right member of the expression (1-1) by using the each symbol digital-converted by the A/D converters 22 and 23. In the similar manner, the multiplier 152-2 calculates the value of the second term of the right member of the expression (1-1). The subtractor 153 produces the phase difference $\Delta\Theta$ shown by the expression (1-1) from the above terms. The subtractor 155 produces the frequency component $\Delta f$ shown by the expression (1-2) obtained by taking the difference between the preceding phase difference $\Delta\Theta(t_{n-1})$ stored in the memory circuit 154 and the phase difference from the multiplier 153. The multiplier 156 is formed of a counter or an accumulator. The frequency component obtained thus integrates the average value of a frequency deviation of a reference carrier wave from demodulation with respect to the carrier frequency of the received signal to send it to the automatic frequency control circuit.

In the conventional frequency discriminator, as shown in FIG. 24, when the signal point $((it_1), q(t_1))$ of the symbol obtained by demodulating the received signal at the time $t_1$ is positioned by way of the axis Q so as to oppose to the signal point $(i(t_2),q(t_2))$ of the symbol obtained by demodulating the received signal at the following time $t_2$, the phase differences at these times are expressed by the following inequalities:

$$\Delta\Theta(t_1) > 0$$

$$\Delta\Theta(t_2) < 0$$

The above inequalities has a different sign to each other. The frequency component obtained from the phase differences is held by the following expression:

$$\Delta f(t_2) = \Delta\Theta(t_2) - \Delta\Theta(t_1) < 0$$

As shown by the above expression, since the sign represents a reversed value, a large error occurs in the frequency deviation of a reference carrier wave to be obtained. Furthermore, the error occurs on the I axis in the signal space. Without being limited to the 4-phase PSK modulation system, the error occurs in the quadrature modulation system having a large number of multilevels such as 16QAM.

In the multi-level quadrature amplitude modulation system such as 16QAM modulation, since a change in the amplitude component of a received signal according to a transmission information varies the direct distance from the origin of the signal space to a signal point corresponding to the signal, an error in the phase difference calculated by the expression (1-1) occurs, thus resulting in a degraded accuracy to the frequency deviation of a reference carrier wave.

SUMMARY OF THE INVENTION

The present invention is made to overcome the above mentioned problems. A first object of the present invention is to provide a quasi-synchronous detection and demodulation circuit which is capable of removing a phase contingent by setting the phase of a carrier added at a demodulation time to the same phase as that of a transmitted carrier.

A second object of the present invention is to provide a frequency discriminator which is used in the quasi-synchronous detection and demodulation circuit and is capable of obtaining with good accuracy a frequency deviation of a reference carrier for demodulation with respect to a received signal carrier in spite of different amplitude phase modulating systems.

In order to achieve the first object, a quasi-synchronous detection and demodulation circuit according to the present invention is characterized by quadrature detection means for performing a quasi-synchronous detection of a quadrature amplitude demodulation signal and for issuing two series of quadrature detection signals; phase rotating means for rotating in phase the quadrature detection signals from the quadrature detecting means to issue two series of demodulation signals with no rotation; carrier generating means for providing an output carrier signal having phase rotation information to the phase rotating means; frame-pattern detecting means for detecting a frame-pattern by two series of demodulation signals from the phase rotating means; and carrier phase compensating means for compensating in phase an output carrier from the carrier generating means added to the phase rotating means to detect a normal frame pattern by means of the frame pattern detecting means.

In the quasi-synchronous detection and demodulation device according to the present invention, the carrier generating means accumulates as an address an error signal based on a phase error from the phase rotating means and sends data read from a memory as an output carrier signal; and the carrier phase compensating means adds sequentially an output carrier phase of 0, $\pi/2$, $\pi$, and $3\pi/2$ to the address accumulated to fix an added address value of the normal frame pattern detected by the frame pattern detecting means.

In the quasi-synchronous detection and demodulation device according to the present invention, the carrier generating means comprises error signal detecting means for detecting an error signal based on a phase error from the phase rotating means; error signal accumulating means for accumulating as an address the error signal detected by the error signal detecting means; and a memory for reading a data value based on the address from the error signal accumulating means and for issuing it as an output carrier signal; and the carrier phase compensating means comprises a judging means for judging whether the frame-pattern detecting means has detected a normal frame-pattern; a base-4 counter for issuing sequentially an output carrier phase of 0, $\pi/2$. $\pi$ and $3\pi/2$ and for fixing the output when the judging means judges that the frame-pattern detecting means has detected the normal frame pattern; and adding means for adding an output from the base-4 counter to the address accumulated.

Furthermore, in the quasi-synchronous detection and demodulation device according to the present invention, the carrier generating means accumulates as an address an error signal based on a phase signal from the phase rotating means and issues data value read from a memory as an output carrier signal; and the carrier phase compensating means continues to add an address value which adds $\pi/2$ to an output carrier phase, to the accumulated error signal till the frame-pattern detecting means detects a normal frame-pattern.

In the quasi-synchronous detection and demodulation device according to the present invention, the carrier generating means comprises: error signal detecting means for detecting an error signal based on a phase error from the phase rotating means; error signal accumulating means for accumulating the error signal detected by the error signal detecting means; and a memory for reading a data value based on the address from the error signal accumulating means and for issuing it to as an output carrier signal; and the carrier phase compensating means comprises a judging means for judging whether the frame-pattern detecting means has detected a normal frame-pattern; $\pi/2$ address generating means for issuing an address value which adds $\pi/2$ to an output carrier phase till the judging means detects a normal frame pattern by means of the frame pattern detecting means; and adding means for adding the output from said $\pi/2$ address generating means to the accumulated error signal.

In the quasi-synchronous detection and demodulation device according to the present invention, the carrier generating means accumulates as an address an error signal based on a phase error from the phase rotating means and issues a data value read from a memory as an output carrier signal; and the carrier phase compensating means detects a contingent phase difference from a frame-pattern detected by means of the frame-pattern detecting means and adding an address value corresponding to a detected phase difference to the accumulated address value.

In the quasi-synchronous detection and demodulation device according to the present invention, the carrier generating means comprises error signal detecting means for detecting an error signal based on a phase error from the phase rotating means; error signal accumulating means for accumulating the error signal as an address detected by the error signal detecting means; and a memory for reading out a data value based on the address from the error signal accumulating means and for issuing it as an output carrier signal; and the carrier phase compensating means comprises a contingent phase difference detecting means for detecting a contingent phase difference according to a frame pattern detected by means of the frame pattern detecting means; address value generating means for generating an address value corresponding to a phase difference detected by means of the contingent phase difference detecting means; and adding means for adding an address value generated from the address value generating means to the accumulated address.

According to the above structure, the carrier phase compensating means compensates the phase of a carrier wave supplied from the carrier generating means to the phase rotating means so as to be a frame pattern detected by the frame pattern detecting means to a normal frame pattern.

That is, when the phase of a carrier wave supplied from the carrier generating means is at $\theta t+\pi/2$, $\theta t+\pi$, or $\theta t+3\pi/2$, the phase is compensated to $\theta t+0$. When the phase rotating circuit receives a carrier wave with a phase of $\theta t+0$ and reproduces it to a normal digital signal and the frame pattern detecting means detects a normal frame pattern.

As described above, in order to detect the transmitted frame pattern and the normal frame pattern, the phase of a carrier issued from the carrier generating means is compensated, whereby the modulator/demodulator are simplified structurally and can be transmitted a digital signal with less error.

Moreover, in order to achieve the second object, a frequency discriminator suitably used for a quasi-synchronous detection and demodulation device comprising quadrature detecting means for subjecting a quadrature amplitude modulation signal to a quasi-synchronous detection to issue two series of quadrature detection signals; analog to digital converter for digital-converting an analog output from the quadrature detecting means; phase error detecting means for obtaining signs $i_d$, $q_d$ of a coordinate and errors $i_e$, $q_e$ to the coordinate of a normal signal point from the coordinate of the signal point in a signal space showing the symbol, the symbols being obtained by digital-converting by the analog to digital converter, and for obtaining a phase error $\Delta\Theta$ of a reference carrier signal for demodulation with respect to a carrier signal of the quadrature amplitude modulation signal by performing an arithmetic operation of the expression $\Delta\Theta=(i_d\times q_e)-(i_e\times q_d)$; frequency deviation detecting means for differentiating the phase error $\Delta\Theta$ obtained by the phase error detecting means with a time determining a timing of the digital conversion to obtain a frequency deviation of the reference carrier signal with respect to the carrier signal; and limiting means for limiting the frequency deviation obtained by the frequency deviation detecting means to less than an upper limit value according to the accuracy of the reference carrier signal.

In this case, the limiting means comprises a comparator for judging the relative size between a predetermined threshold value and a frequency deviation obtained by the frequency deviation detecting means; and a latch circuit for selectively updating a frequency deviation obtained by the frequency deviation detecting means in accordance with a compared result from the comparator.

The limiting means also comprises a comparator for judging the relative size between a predetermined threshold value and a difference between a preceding frequency deviation before and a following frequency deviation; and a latch circuit for selectively updating a frequency deviation obtained by the frequency deviation detecting means in accordance with a compared result from the comparator.

In the frequency discriminator of the above structure, the limiting means limits the frequency deviation of a reference carrier signal obtained by the phase error detecting means and the frequency deviation detecting means to less than the upper limit value in accordance with the frequency accuracy of the carrier signal.

That is, in a prior art, when a quadrature amplitude modulation wave is sequentially demodulated while the signal point of each symbol obtained similarly through a digital-conversion is oppositely positioned to the signal point of a previously obtained symbol by way of one of the axes in the signal space, a reference carrier signal calculated by the phase error detecting means includes a large phase error $\Delta\ominus$ so that a large error occurs in the frequency deviation obtained by the frequency deviation detecting means. However, such an error can be suppressed through the above limiting procedure.

The frequency discriminator according to the present invention is characterized by quadrature detecting means for subjecting a quadrature amplitude modulation to a quasi-synchronous detection to issue two series of quadrature detection signals; analog to digital converting means for digital-converting an analog output from the quadrature detecting means; phase error detecting means for obtaining signs $i_d$, $q_d$ of a coordinate and errors $i_e$, $q_e$ to the coordinate of a normal signal point from the coordinate of the signal point in a signal space showing the symbol, the symbols being obtained by digital-converting by the analog to digital converter, and for obtaining a phase error $\Delta\ominus$ of a reference carrier signal for demodulation with respect to a carrier signal of the quadrature amplitude modulation signal by performing an arithmetic operation of the expression $\Delta\ominus = (i_d \times q_e) - (q_e \times q_d)$; frequency deviation detecting means for differentiating the phase error $\Delta\ominus$ obtained by the phase error detecting means with a time determining a timing of the digital conversion to obtain a frequency deviation of the reference carrier signal with respect to the carrier signal; and output control means for judging whether a signal point of the symbol point is positioned a forbidden area or the other area based on the coordinate, the forbidden area being sandwiched between each of the axes and a virtual line rotated bidirectionally and at a predetermined angle around the origin in the signal space, and for thinly issuing the frequency deviation obtained by the frequency deviation detecting means in accordance with the judged result.

In this case, the output control means comprises signal point judging means for judging whether a signal point of the symbol point is positioned a forbidden area or other areas based on said coordinate, the forbidden area being sandwiched between each of the axes and a virtual line rotated bidirectionally at a predetermined angle around the origin in the signal space, and means for thinly issuing the frequency deviation obtained by the frequency deviation detecting means in accordance with the judged result by means of the signal point judging means.

In the frequency discriminator, when the coordinate of each symbol in the signal space, obtained by demodulating sequentially the quadrature amplitude modulation wave through a digital conversion, is positioned outside the area between a virtual line and each of axes, the virtual line being made by rotating bidirectionally the coordinate of each symbol by a predetermined angle and around the origin in a signal space, the output control means outputs a frequency deviation of the reference carrier signal obtained by the frequency deviation detecting means. To the contrary, when the coordinate is positioned in the above area, the output of the frequency deviation is thinned out.

Generally, when being oppositely positioned with respect to the preceding symbol by way of an axis in a signal space, such a symbol tends to be in the area sandwiched between the axis and the above virtual line. The angle of the virtual line can be set to a value proportional to a product of the maximum frequency deviation of a reference carrier signal and the maximum period of the above digital conversion and can be preset to the value. In the similar manner to the above frequency discriminator, the error of the frequency deviation obtained by the frequency deviation detecting means can be suppressed. The frequency discriminator according to the present invention is characterized by quadrature detecting means for subjecting an quadrature amplitude modulation to a quasi-synchronous detection to issue two series of quadrature detection signals; analog to digital converter for digital-converting an analog output from said quadrature detecting means; phase error detecting means for obtaining signs $i_d$, $q_d$ of a coordinate and errors $i_e$, $q_e$ to the coordinate of a normal signal point from the coordinate of a signal point in a signal space showing each of symbols, the symbols obtained by digital-converting by the analog to digital converter, and for obtaining a phase error $\Delta\ominus$ of a reference carrier signal for demodulation with respect to a carrier signal of said quadrature amplitude modulation signal by performing an arithmetic operation of the expression $\Delta\ominus = (i_d \times q_e) - (i_e \times q_d)$; frequency deviation detecting means for differentiating the phase error $\Delta\ominus$ obtained by said phase error detecting means with a time determining a timing of said digital conversion to obtain a frequency deviation of said reference carrier signal with respect to the carrier signal; and output control means for judging a difference in sign between the phase error $\Delta\ominus$ obtained by the phase error detecting means and the phase error obtained similarly and previously with respect to the deviation and for issuing thinly a frequency deviation obtained by means of the frequency deviation detecting means in accordance with the judged result.

In this case, the output control means comprises judging means for judging a difference in sign between the phase error $\Delta\ominus$ obtained by the phase error detecting means; and phase error obtained similarly and previously with respect to the deviation and for issuing thinly a frequency deviation obtained by means of the frequency deviation detecting means in accordance with the judged result from the judging means.

The frequency discriminator with the above configuration utilizes that when each symbol obtained by sequentially demodulating and digital-converting the quadrature amplitude modulation wave is on the opposite side to the previously and similarly obtained symbol by way of an axis in the signal space, the sign of the phase error $\Delta\ominus$ obtained by the phase error detecting means is reversed. When judging that the sign is not reversed, the output control means outputs a frequency deviation obtained by the frequency deviation detecting means. When the sign is reversed, the output of the frequency deviation is thinned. Hence the error of the frequency deviation obtained by the frequency deviation detecting means is suppressed.

A frequency discriminator according to the present invention is characterized by quadrature detecting means for subjecting a quadrature amplitude modulation to a quasi-synchronous detection to issue two series of quadrature detection signals; analog to digital converter for digital-converting an analog output from the quadrature detecting means; phase error detecting means for obtaining signs $i_d$, $q_d$ of a coordinate and errors $i_e$, $q_e$ to the coordinate of a normal signal point from the coordinate of a signal point in a signal space showing each of symbols, the symbols obtained by digital-converting by the analog to digital converter, and for obtaining a phase error $\Delta\ominus$ of a reference carrier signal for demodulation with respect to a carrier signal of the quadrature amplitude modulation signal by performing an arithmetic operation of the expression $\Delta\ominus = (i_d \times q_e) - (i_e \times q_d)$; frequency deviation detecting means for differentiating the phase error $\Delta\ominus$ obtained by the phase error detecting means with a time determining a timing of the digital conversion to obtain a frequency deviation of the reference carrier signal with respect to the carrier signal; and output control means for judging wether the signal point of the symbol is positioned in an area in the signal space showing an allowable area of the phase error $\Delta\ominus$ and near to each signal point being at the same direct distance from the origin, or other areas, and for issuing thinly a frequency deviation obtained by means of the frequency deviation detecting means in accordance with the judged result.

In this case, the output control means comprises judging means for judging whether the signal point of the symbol is positioned in an area or other areas in the signal space, the area showing an allowable area of the phase error $\Delta\ominus$ and near to each signal point being at the same direct distance from the origin, and means for issuing thinly a frequency deviation obtained by the frequency deviation detecting means in accordance with the judged result from the judging means.

In the frequency discriminator, the output control means outputs the frequency deviation obtained by the frequency deviation detecting means when a symbol which is used to calculate a phase error $\Delta\ominus$ by the phase error detecting means includes a signal point having the same direct distance from the origin in the signal space and is outside the area being an allowable range of the phase error near to the signal point. When the symbol is in the above area, the output of the frequency deviation is thinned.

That is, since the frequency deviation of the reference carrier wave calculated by the frequency deviation detecting means based on the symbol having the same direct distance from the origin in the signal space is obtained at the output terminal of the output control means, the deviation accuracy is maintained at a high value even if the amplitude component of the quadrature modulation wave varies in accordance with a transmission information.

A frequency discriminator according to the present invention is characterized by quadrature detecting means for subjecting a quadrature amplitude modulation to a quasi-synchronous detection to issue two series of quadrature detection signals; analog to digital converter for digital-converting an analog output from the quadrature detecting means; phase error detecting means for obtaining signs $i_d$, $q_d$ of a coordinate and errors $i_e$, $q_e$ to the coordinate of a signal point in a signal space showing a symbol, symbols obtained by digital-converting by the analog to digital converter, and for obtaining a phase error $\Delta\ominus$ of a reference carrier signal for demodulation with respect to a carrier signal of the quadrature amplitude modulation signal by performing an arithmetic operation of the expression $\Delta\ominus = (i_d \times q_e) - (i_e \times q_d)$; amplitude component calculating means for calculating a direct distance from the origin of the coordinate in the signal space in accordance with the coordinate; normalizing means for dividing a phase error $\Delta\ominus$ obtained by the phase error detecting means by the direct distance obtained by the amplitude component calculating means and by normalizing the phase error by the direct distance; and frequency deviation detecting means for differentiating the phase error normalized by the normalizing means by a time defining a timing of the digital conversion, and for obtaining a frequency deviation of the reference carrier signal with respect to the carrier signal.

In the frequency discriminator structure, the amplitude component calculating means calculates the direct distance from the origin of the space based on the coordinate of each symbol in the signal space obtained by modulating and digital-converting the quadrature amplitude modulated wave, and the normalizing means divides the phase error $\Delta\ominus$ of a reference carrier signal obtained by the phase error detecting means by the direct distance.

The direct distance shows a variation in accordance with the transmission information on the amplitude of the quadrature amplitude modified wave. Since the frequency deviation detecting means differentiates a phase error normalized using the direct distance by time to obtain the frequency deviation of a reference carrier signal, the deviation accuracy is maintained at high value, without depending on the kind of the quadrature amplitude modulation system.

Therefore, according to the frequency discriminator used the quasi-synchronous detection and demodulation device according to the present invention, the frequency deviation of a reference carrier wave for demodulation is obtained by subjecting the coordinates in a signal space of symbols to a predetermined arithmetic operation, the symbols being obtained sequentially by demodulating an quadrature amplitude modulated wave. A large error can be suppressed by thinning the output based on either whether a coordinate is near to the axis of the signal space or whether the sign of a phase error obtained on the process of the arithmetic operation is reversed, or by limiting directly the deviation value deviating from the area sandwiched between the upper and lower limit values determined with the frequency accuracy of the reference carrier signal.

When the amplitude of a quadrature amplitude modulated wave varies in response to the transmission information, the frequency deviation can be calculated after selecting only the frequency deviation calculated based on symbols shown with the coordinates being at the same direct distance from the origin in the signal space corresponding to the variations, or by normalizing the phase error by the direct distance.

That is, since the signal point of each symbol is oppositely positioned to the signal point of the previously obtained symbol by way of an axis in the signal space, even if the phase has a large error, the error of the frequency deviation of a reference carrier signal due to the error occurring in the conventional discriminator can be suppressed. Even if the system employs the amplitude phase modulation system, the error due to the amplitude variations of a modulated wave can be reduced.

Therefore the reference carrier frequency variable control device using the frequency discriminator of the present invention can realize a stable demodulation process and its improved performance, without depending on the kind of the modulation system.

BRIEF DESCRIPTION OF THE DRAWINGS

FIG. 12 is a block diagram showing the fourth concrete examples of the main configuration of the second embodiment;

DESCRIPTION OF THE PREFERRED EMBODIMENTS

Referring to the attached drawings, an explanation will be made in detail as for preferred embodiments of the quasi-synchronous detection and demodulation circuit according to the present invention.

(a) Explanation of the First Embodiment

Figure 1:
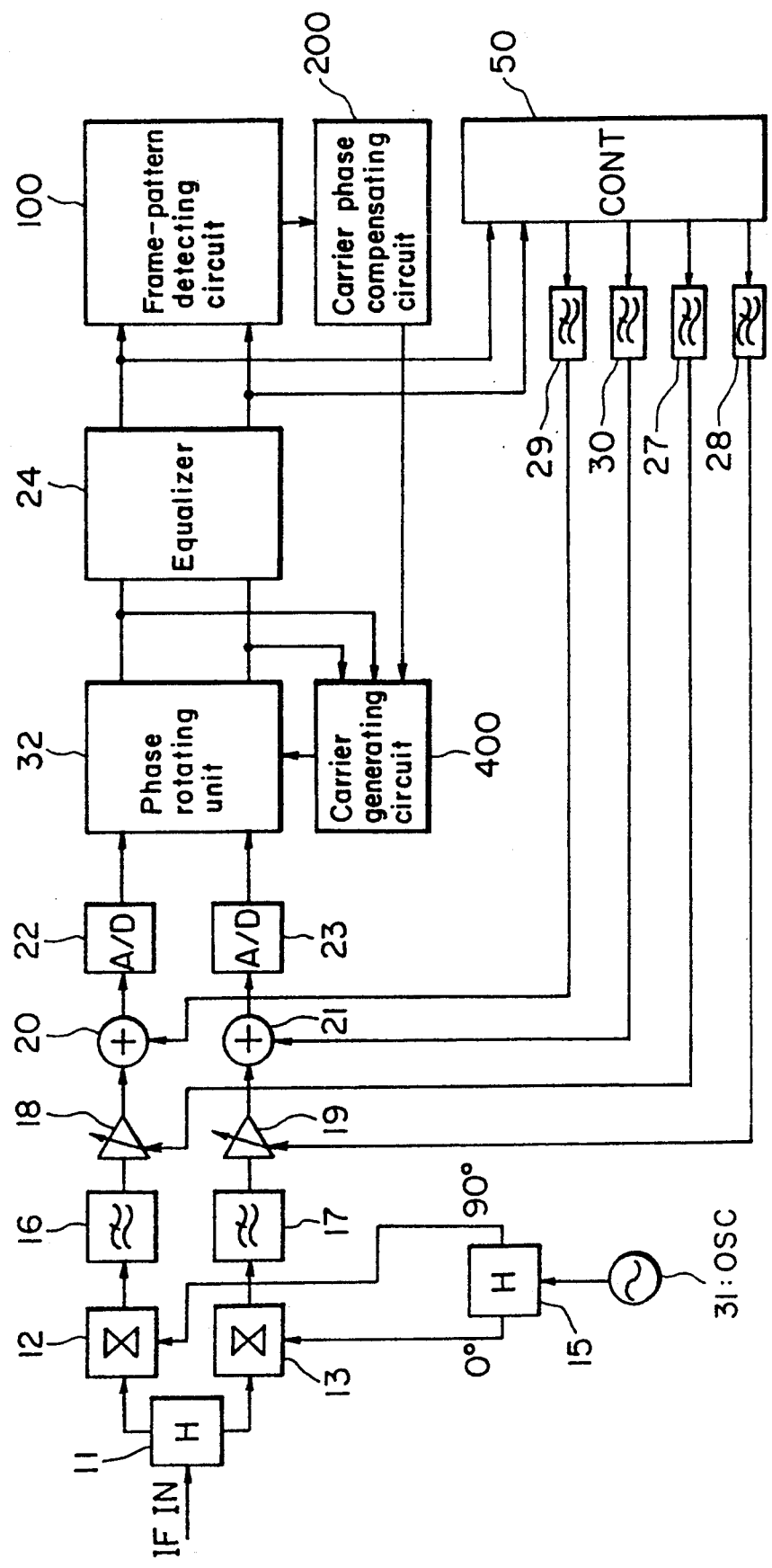
FIG. 1 is a block diagram showing a first embodiment of a quasi-synchronous detection and demodulation circuit according to the present invention.

FIG. 1 is a block diagram showing a quasi-synchronous detection and demodulation circuit with a phase contingent removing function according to the first embodiment of the present invention. The quasi-synchronous detection and demodulation circuit is constituted of a hybrid (H) 11, detecting circuits 12 and 13, a voltage controlled oscillator (VCO) 31, a 90-degree hybrid (H) 15, low pass filters 16 and 17, variable gain amplifiers 18 and 19, adders 20 and 21, A/D converters 22 and 23, an equalizer 24, a control unit (CONT) 50, low pass filters 27, 28, 29, and 30, a phase rotation unit (phase rotating means) 32, a frame pattern detecting circuit 100, a carrier phase compensating means 200, and a carrier generating means 400.

Since the conventional quasi-synchronous detection and demodulation circuit uses like elements, an explanation will be omitted regarding the hybrid (H) 11, the detecting circuits 12 and 13, the voltage controlled oscillator (VCO) 31, the 90-degree hybrid (H) 15, the low pass filters 16 and 17, variable gain amplifiers 18 and 19, the adders 20, 21, the A/D converters 22 and 23, the equalizer 24, low pass filters 27, 28, 29 and 30, and the phase rotation unit 32.

The control unit 50 performs gain and drift controls in the function of the conventional control unit 25.

The frame pattern detecting circuit 100 detects a frame pattern in accordance with two series of demodulation signals from the phase rotation unit 32. The carrier generating means 400 provides output carrier signals (a sine signal and a cosine signal) having rotation information to the phase rotation unit 32. In order to detect the normal frame pattern by the frame pattern detecting circuit 100, the carrier phase compensating means 200 compensates the phase of an output carrier wave to be inputted to the phase rotation unit 32 from the carrier generating means 400.

Next, an explanation will be made below regarding the principle of the present embodiment before starting a detail explanation thereof.

The QAM signal S(1) is held by the following expression:

$$S(t) = A_I(t) \text{ cosine }(W_s t) + A_q(t) \text{ sine }(W_s t) \quad (2\text{-}1)$$

where in ease of 16QAM, $A_I(t)$ and $A_q(t)$ take $+-1$ or $+-3$ corresponding to an input digital signal.

The demodulator performs an asynchronous detection by adding a carrier wave, Wi near to the carrier wave Ws of an input signal S(t) to the input signal S(t). Namely, after the input signal S(t) is multiplied by cosine($W_i t$) and sin($W_i t$), the outcome is passed through the low pass filter to produce the demodulation signals I(t) and Q(t).

I(t) and Q( t ) are held by the following expressions:

$$\begin{aligned} I(t) &= S(t)\text{cosine}(W_i t) \\ &= [A_I(t)\text{cosine}(\theta t) + A_q(t)\text{sine}(\theta t)]/2 \end{aligned} \quad (2\text{-}2)$$

-continued $$Q(t) = S(t)\text{sine}(W_i t) \quad (2\text{-}3)$$
$$= [-A_i(t)\text{sine}(\theta t) + A_q(t)\text{cosine}(\theta t)]/2$$

where $\theta = Ws - Wi$.

The target demodulation signals are $A_i(t)$ and $A_q(t)$. Since I(t) and Q(t) indicated by the expressions (2-2) and (2-3) include sine($\theta t$) and cosine($\theta t$) being rotatable with an angular velocity $\theta$, the rotation unit 32 executes the following arithmetic operation:

$$I(t) \text{ cosine } (\theta t) + Q(t) \text{ sine } (\theta t) = A_i(t) \quad (2\text{-}4)$$

$$-I(t) \text{ sine } (\theta t) + Q(t) \text{ cosine } (\theta t) = A_q(t) \quad (2\text{-}5)$$

Ai(t) is obtained by calculating the left member of the expression (2-4) and Aq(t) is obtained by calculating the left member of the expression (2-5). The cosine($\theta t$) and the sine($\theta t$) of the expression (2-4) and (2-5) are added by the carrier generating circuit 400.

The carrier wave from the carrier generating circuit expressed by the expressions (2-4) and (2-5) represents sine($\theta t$) and cosine($\theta t$). The carrier wave supplied from the carrier generating circuit may have a phase of $\theta t + \pi/2$, $\theta t + \pi$, or $\theta t + 3\pi/2$, in addition of a phase of $t + 0$.

When a carrier having a phase except ($\theta t + 0$) is supplied to the phase rotation circuit, the operational results of the expressions (2-4) and (2-5) are not Ai(t) and Aq(t), respectively, so that the original signal cannot be demodulated.

For this case, the frame pattern detecting circuit 100 is needed. When a digital signal is transmitted, either a multiplexed signal or a frame signal needed to separate a data unit on the receiving side is added to it. The frame signal is produced with the same pattern at every predetermined intervals.

Therefore the carrier phase produced from the carrier generating circuit 400 is compensated in such a manner that the frame pattern detecting circuit 100 can receive the normal frame pattern.

Figure 2:
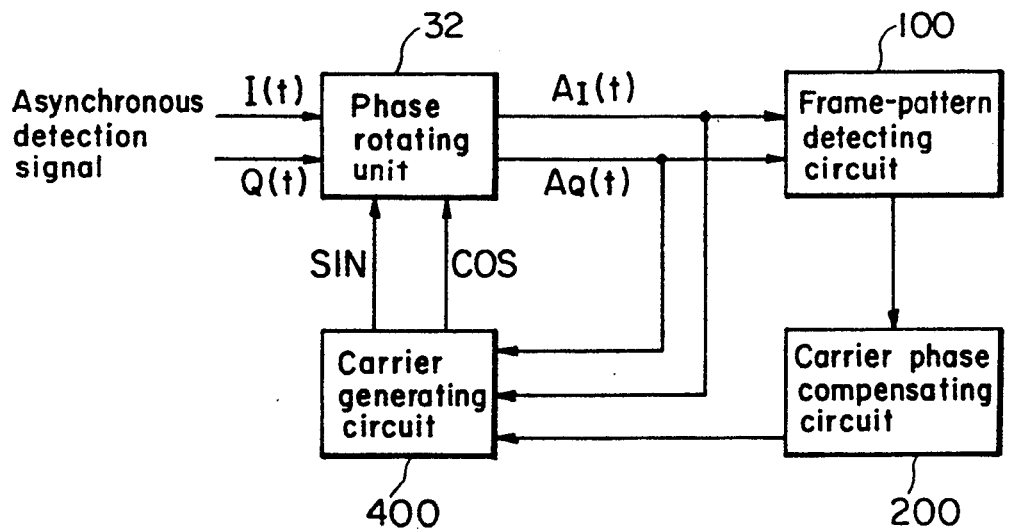
FIG. 2 is a block diagram showing the main configuration of the first embodiment according to the present invention.

FIG. 2 is a clock diagram showing the main structure of the present embodiment. In FIG. 2, The carrier generating circuit 400 receives signals I(t) and Q(t) indicated by the expressions (2-2) and (2-3) and produces the result calculated according to the left members of the expressions (2-4) and (2-5) using two quadrature carrier waves.

Next, the first embodiments of the carrier generating circuit 400 and the carrier compensating circuit 200 will be explained with reference to FIG. 3.

The carrier generating circuit 400 is constituted of a memory 410, an adder 420, and a phase error detector 430. The carrier phase compensating circuit 200 is constituted of a memory 210, a base-4 counter 220 an AND circuit 230, and an adder 240.

First the carrier generating circuit 400 will be explained below.

The memory 410 stores a sine value and a cosine value where the phase angle of a generating carrier corresponds to an address as a phase angle. For example, when an address is defined from "0" to "359", the memory 410 stores sine (x) and cosine(x) at an address x.

The phase error detector 430 receives the output from the phase rotation unit 32, or the calculated results Ai(t) and Aq(t) of the left member of the expressions (2-4) and (2-5), and produces the phase error output PD obtained by calculating the following expression:

$$PD = SGM\{A_i(t)\}*ER\{Aq(t)\} + SGM(Aq(t)*ER-\{A_i(t)\} \quad (2\text{-}6)$$

where SGM(A(t)) shows a positive or negative polarity of (A(t)) and ER(A(t)) shows an error deviating from a normalized value.

The adder 420 receives the output value PD from the phase error detector 430 to add it to an added value stored therein. The adder 430 executes an addition ruled by an address value of the memory 410. That is, when the address of the memory 410 is "0" through "359" and the added value "360" of the adder 420 is 0 and the added value "361" is 1, a modulo-360 addition is performed.

The memory 410 receives an added value as an address from the adder 420 and reads the sine value and the cosine value corresponding to the address to output them to the phase rotation unit 32.

In the carrier phase compensating circuit 200, the memory 210 comprises a memory having four addresses. The memory stores 0 at an address "0", an address value corresponding to 90° being the angle stored in the memory 410 in the carrier generating circuit 400 at an address "1", an address value corresponding to 180° at an address "2", and an address value corresponding to 270° of an address "3".

The AND circuit 230 receives a signal "1" and a low frequency clock pulse with a period longer than the transmission period of the frame pattern, the signal "1" being produced when the frame pattern detecting circuit 100 does not detect a normal frame pattern. The base-4 counter 220 adds pulses from he AND circuit 230.

The memory 210 reads out data in response to the counted value as an address from the base-4 counter 220. The adder 240 adds it to the data value from the adder 420 to output an address to the memory 410.

When the AND circuit 230 receives a signal of "1" from the frame pulse detecting circuit 100, the low frequency clock pulse sent through the AND circuit 230 increments the base-4 counter 220 by +1.

When the counted value of the base-4 counter 220 is incremented by +1, the memory 210 read out data obtained by adding 90° to the previous data value so that the memory 410 reads out a carrier wave with a phase added by 90°.

In this state, if the frame pattern detecting circuit 100 does not detect a normal frame pattern, the AND circuit 230 receives a logical level "1", whereby the base-4 counter 220 increments its counting vslue by +1. If the frame pattern detecting circuit 100 detects a normal frame pattern, the AND circuit 230 outputs a logical level "0" and prohibits a low frequency clock passing through the base-4 counter 220.

Next, the second embodiment will be explained with reference to FIG. 4. In FIG. 4, an explanation will be omitted as for the carrier generating circuit 400 because being similar to that shown in FIG. 3.

The carrier phase compensating circuit 200 is constituted of an AND circuit 230, an adder 240, a $\pi/2$ address generator 250. The $\pi/2$ address generator 250 generates an address value which advances the carrier output from the memory 410 by 90° in phase. That is, as shown by the foregoing example, when the address of the memory 410 changes from "0" to "359", the $\pi/2$ address generator 250 generates 90.

As explained in the first embodiment, when receiving "1" from the frame pattern detecting means 100, the AND circuit 230 passes through a clock pulse with low frequency. The $\pi/2$ address generating circuit 250 receives the clock pulse and outputs 90 to the adder 240. The adder 240 adds 90 to the signal from the phase error detector 430.

After the Adder 240 adds the output from the $\pi/2$ address generator 250 with the output from the phase error detector 430, the $\pi/2$ address generator 250 outputs 0. Hence every time the AND circuit 230 outputs a low frequency clock pulse, the memory 410 reads out a carrier with a phase which is shifted by 90° from the normal phase.

Figure 5:
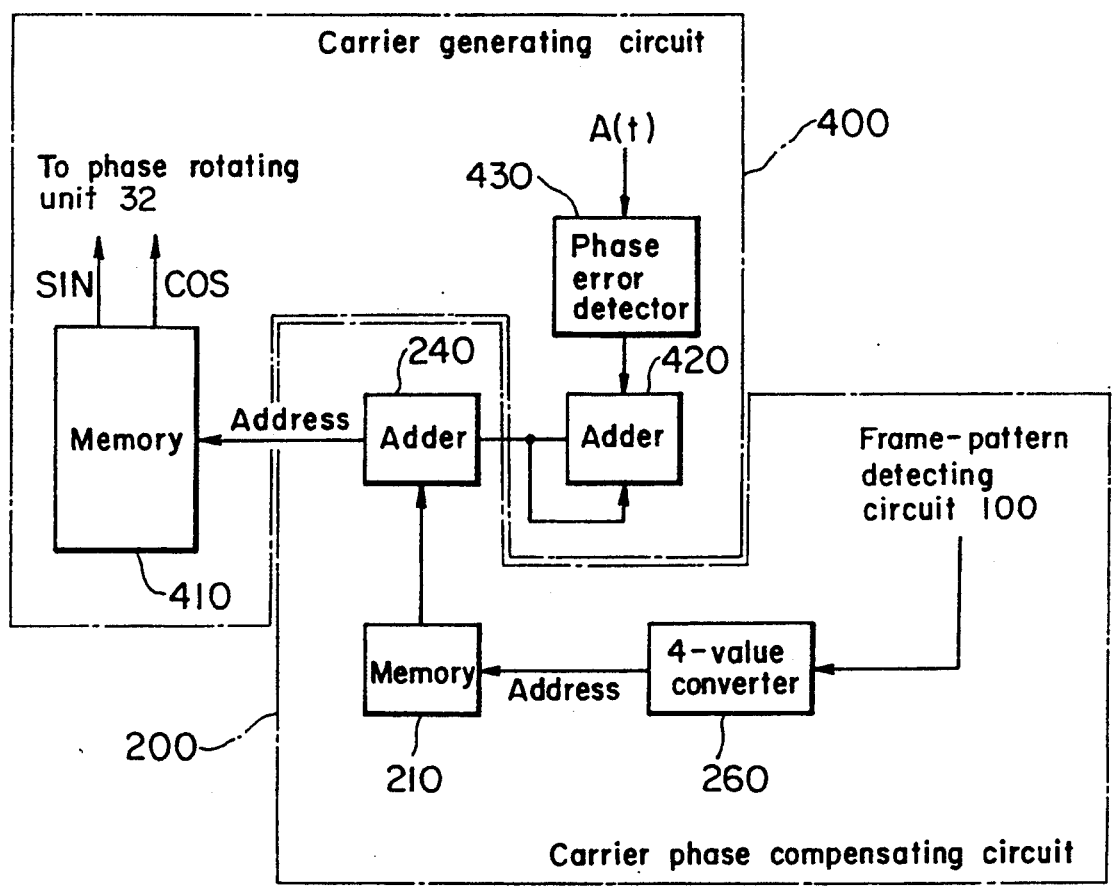
FIG. 5 is a block diagram showing the third concrete examples of the carrier generating circuit and the carrier phase compensating circuit in the first embodiment.

Next, the third embodiment will be explained with reference to FIG. 5. The carrier generating circuit 400 in FIG. 5 is similar to that in FIG. 3, its explanation will be omitted.

The carrier phase compensating circuit 200 comprises an adder 240 and a 4-value converter 260. The memory 210 and the adder 240 have been explained with reference to FIG. 3.

In the third embodiment, a phase difference between a carrier indicated by the expressions (2-2) and (2-3) inputted in the phase rotation unit 32 and a carrier supplied from the carrier generating circuit 4 is detected. The phase difference is detected as follows:

The the same frame pattern, as described foregoing, is transmitted at every fixed intervals. When one bit in a pattern is normal (or the phase difference of a carrier is 0), provided that Ai=0 and Aq=0, the carriers having phases of 90°, 180°, and 270° are received according to the following expressions:

$$\begin{aligned}
\text{Phase difference} \quad 0°: & \quad A_1 = 0, A_q = 0 \\
\text{Phase difference} \quad 90°: & \quad A_1 = 0, A_q = 1 \\
\text{Phase difference} \quad 180°: & \quad A_1 = 1, A_q = 1 \\
\text{Phase difference} \quad 270°: & \quad A_1 = 1, A_q = 0
\end{aligned} \quad (2\text{-}7)$$

where Ai and Aq are signs representing a positive or negative polarity of Ai and Aq of the expression (1), and 0 represents a negative polarity and 1 represents a positive polarity.

As described above, a phase difference can be detected by using the frame pattern bit detected by the frame pattern detecting circuit 100. The 4-value converter 260 converts so as to output 0 in a phase difference of 0°, 1 in a phase difference of 90°, 2 in a phase difference of 180°, and 3 in a phase of 270°.

In the example shown by the expression (2-7), by assuming that Ai is 2′ in binary notation and Aq is 2q in binary notation, the 4-value converter 260 converts the output values $D_1$ and $D_0$ as follows:

$$D_1 = A_i$$

$$D_0 = A_i \oplus A_q \quad (2\text{-}8)$$

where $\oplus$ shows an exclusive-OR. Namely, when the phase difference is 180°, the output value is converted into the sign corresponding to 270°. When the phase difference is 270°, the output value is converted into the sign corresponding to 180°.

Figure 3:
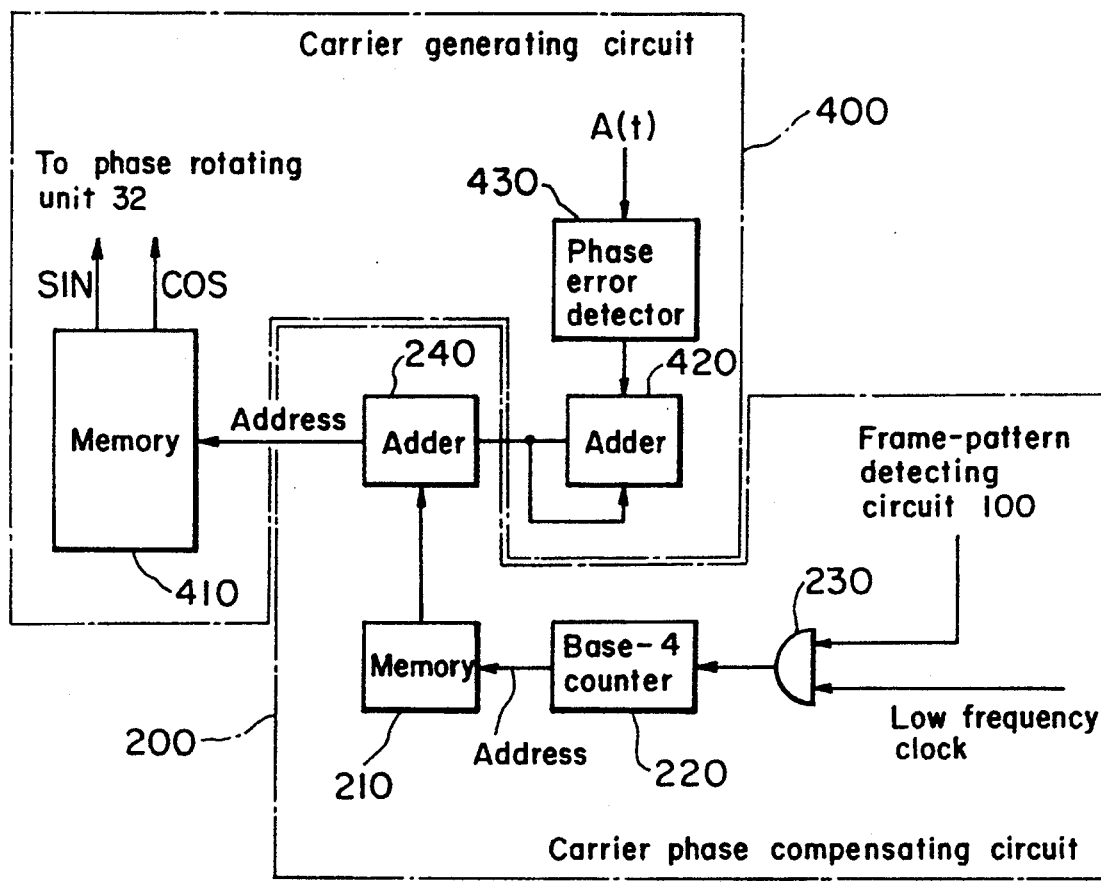
FIG. 3 is a block diagram showing the first concrete examples of the carrier generating circuit and the carrier phase compensating circuit in the first embodiment.
Figure 4:
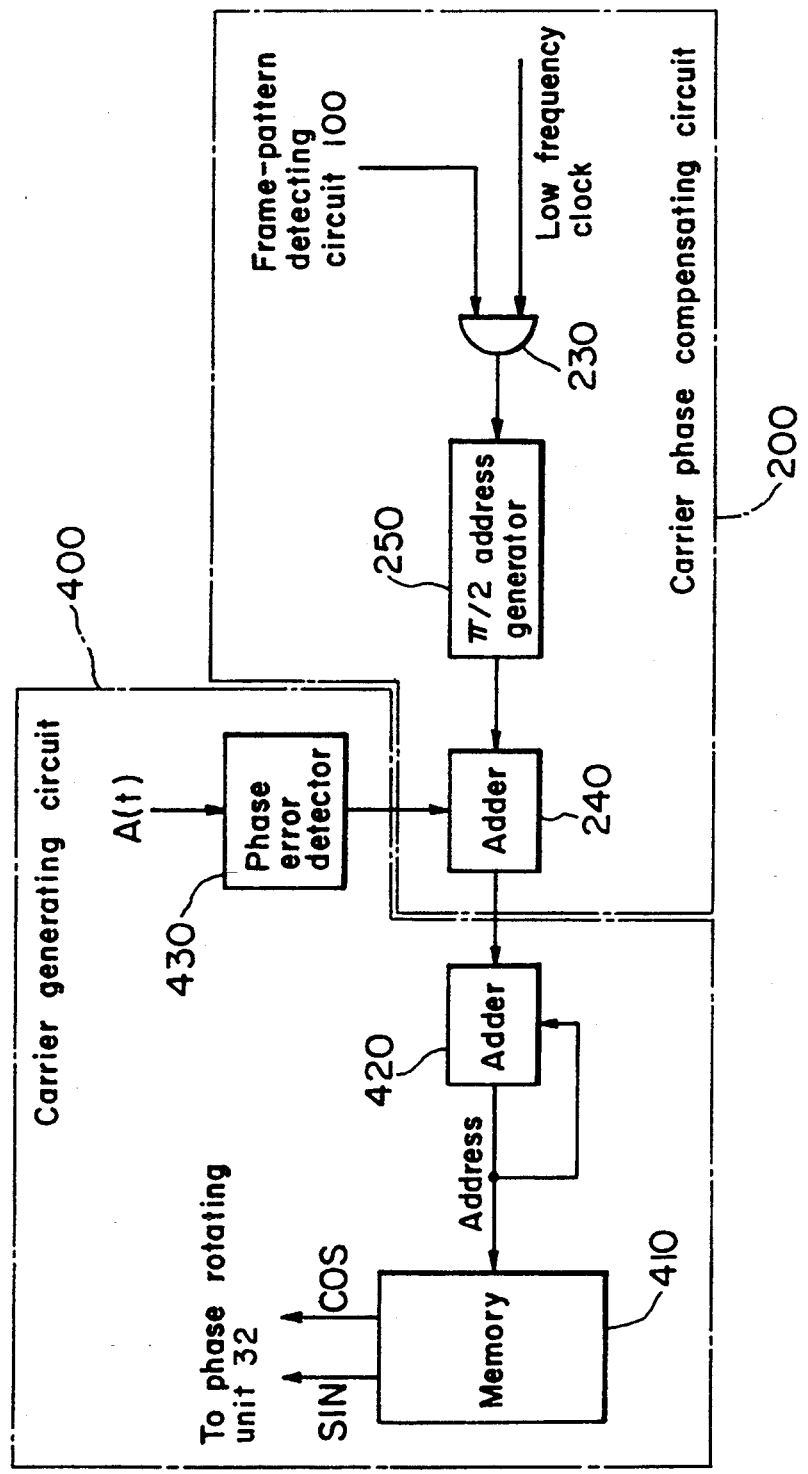
FIG. 4 is a block diagram showing the second concrete examples of the carrier generating circuit and the carrier phase compensating circuit in the first embodiment.

As described above, since signals converted into 4 value are the same as the output values from the base-4 counter 220 in the first embodiment shown in FIG. 3, the output from the carrier generating circuit 400 is compensated to a correct phase.

As described above, an explanation has been made as for the first embodiment according to the present invention. The present invention should not be limited to the first embodiment to achieve the first object. Various modifications can be made according to the scope of the present invention.

(b) Explanation of the second embodiment

Next, a detail explanation will be made regarding the second embodiment according to the present invention.

Figure 6:
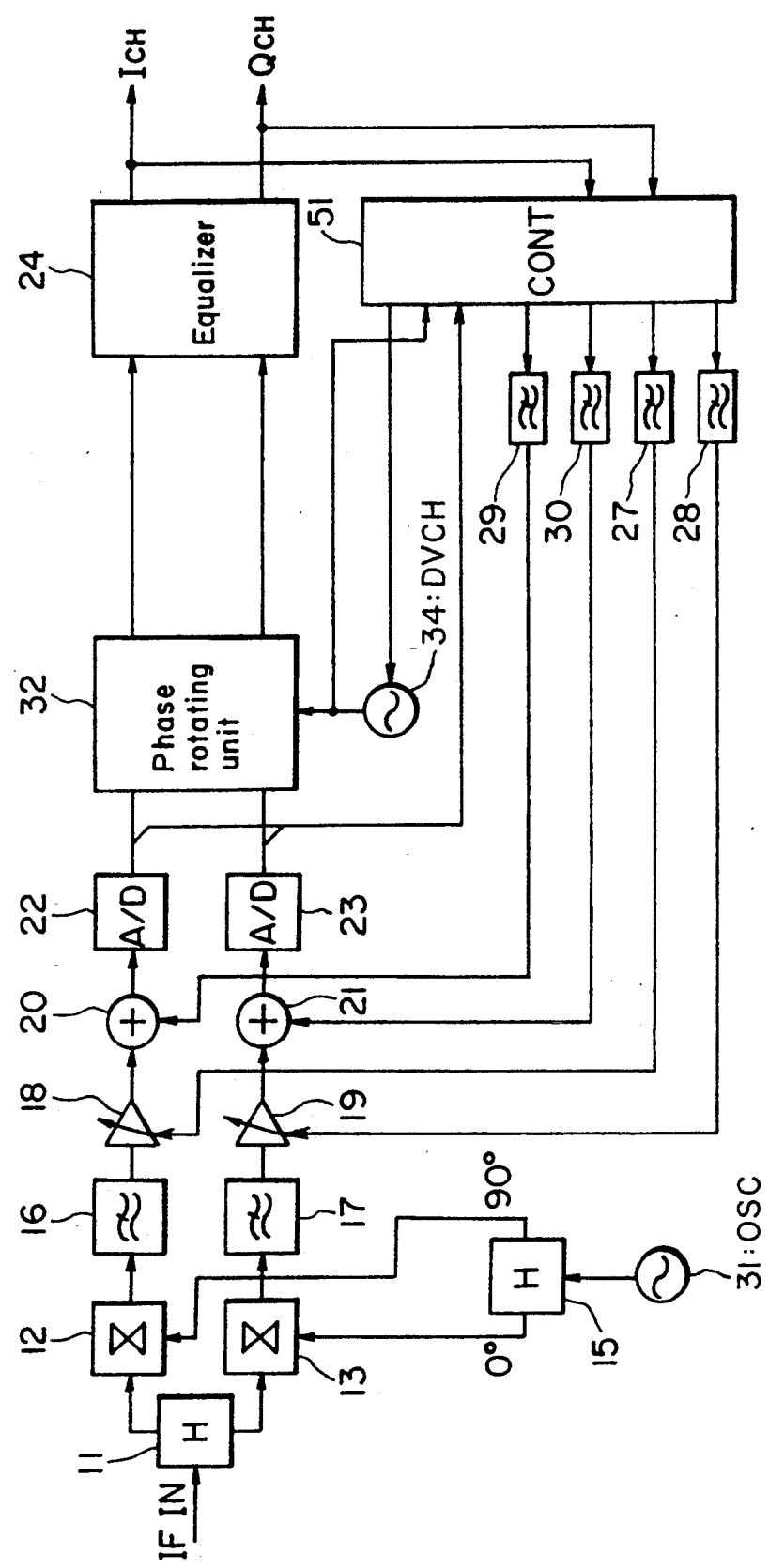
FIG. 6 is a block diagram showing a second embodiment quasi-synchronous detection and demodulation circuit according the present invention.

FIG. 6 is a block diagram showing a quasi-synchronous detection and demodulation circuit according to the second embodiment of the present invention. The quasi-synchronous detection and demodulation circuit is constituted of a hybrid (H) 11, detecting circuits 12 and 13, voltage controlled oscillator (VCO) 31, a 90-degree hybrid (H) 15, low pass filters 16 and 17, variable gain amplifiers 18 and 19, adders 20 and 21, A/D converters 22 and 23, an equalizer 24, control unit (CONT) 51, low pass filters 27, 28, 29, and 30, a phase rotation unit (phase rotation means) 32, and a DVCO 34.

Here, since the conventional quasi-synchronous detection and demodulation circuit includes the similar elements, an overlapped explanation will be not made regarding the hybrid (H) 11, the detecting circuits 12 and 13, the voltage controlled oscillator (VCO) 31, the 90-degree hybrid (H) 15, low pass filters 16 and 17, variable gain amplifiers 18 and 19, the adders 20 and 21, the A/D converters 22 and 23, the equalizer 24, the low pass filters 27, 28, 29, and 30, the phase rotation unit 32, and the DVCO 34. The control unit 51 has nearly the same function as the foregoing control unit 25.

Figure 7:
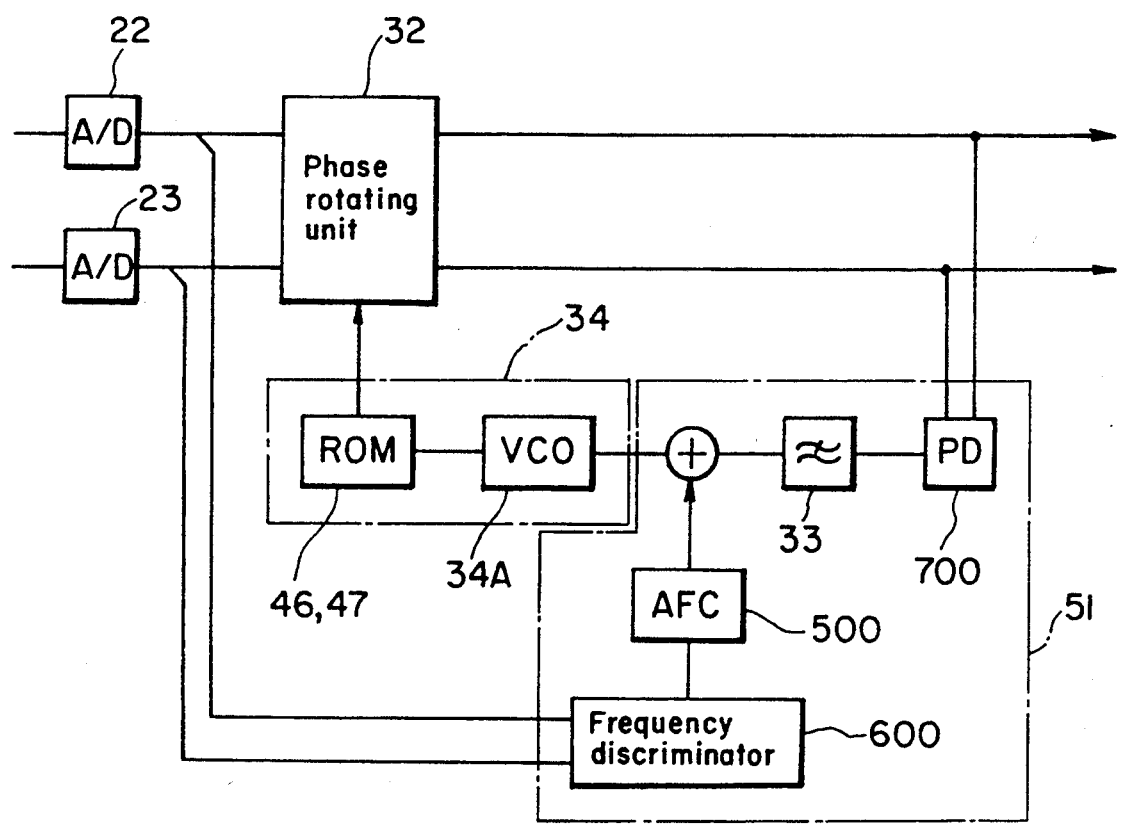
FIG. 7 is a block diagram showing the main configuration of the second embodiment of the present invention.

FIG. 7 is a block diagram showing the main portion of a quasi-synchronous detection and demodulation circuit according to the second embodiment of the present invention. As shown in FIG. 7. The output from the automatic frequency control circuit 500 is added between the VCO (accumulator) 34A in the DVCO 34 and the low pass filter 33.

The automatic frequency control circuit 500 receives the output from the frequency discriminator 600 according to the present invention. In FIG. 7, the phase difference detector 700 corresponds to the phase error detector 430 shown in the first embodiment.

Figure 8:
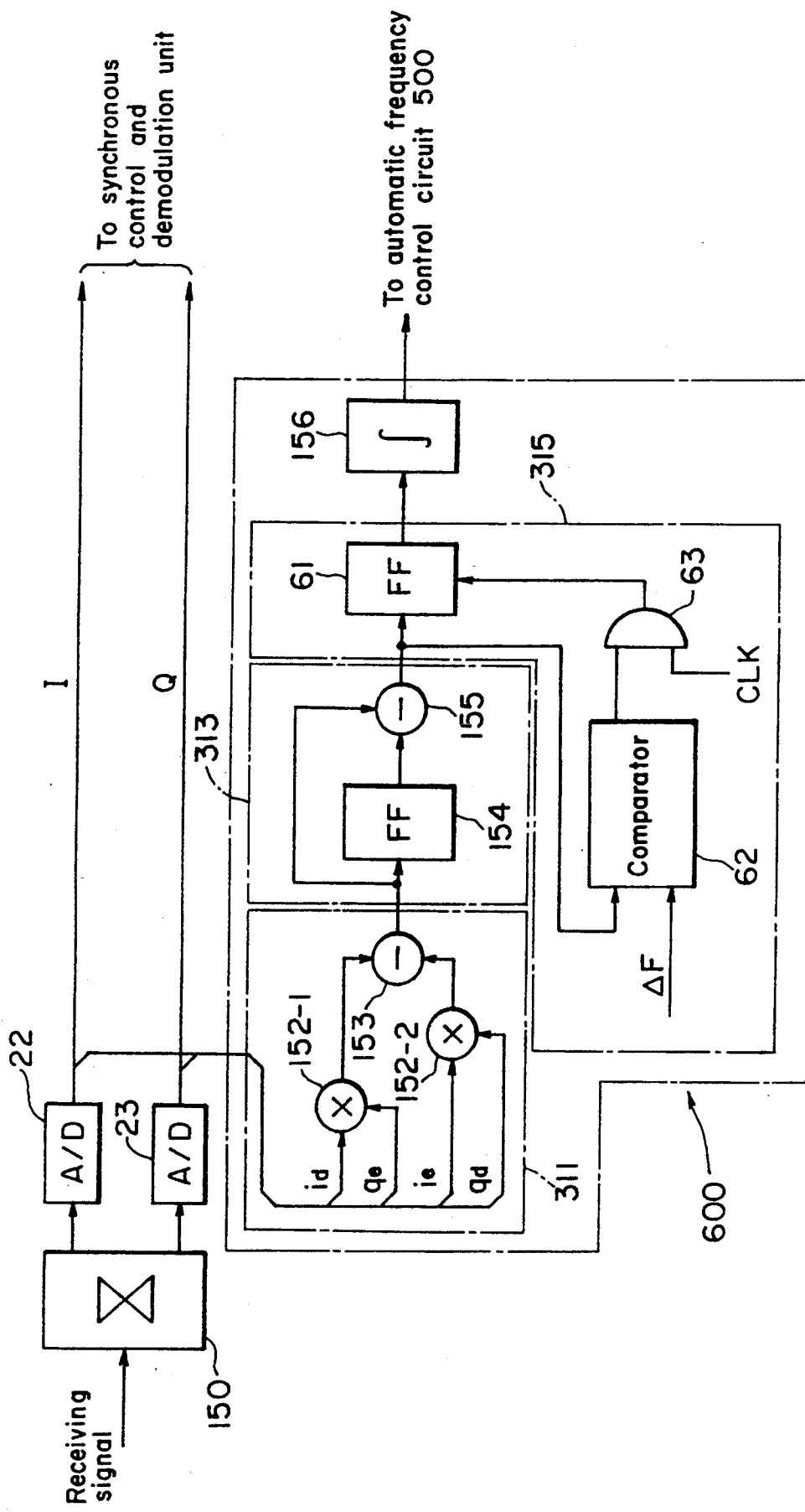
FIG. 8 is a block diagram showing of the first concrete example of the main configuration according to the second embodiment of the present invention.

FIG. 8 is a block diagram showing the first embodiment of the main portion according to the present embodiment of the quasi-synchronous detection and demodulation circuit.

Figure 22:
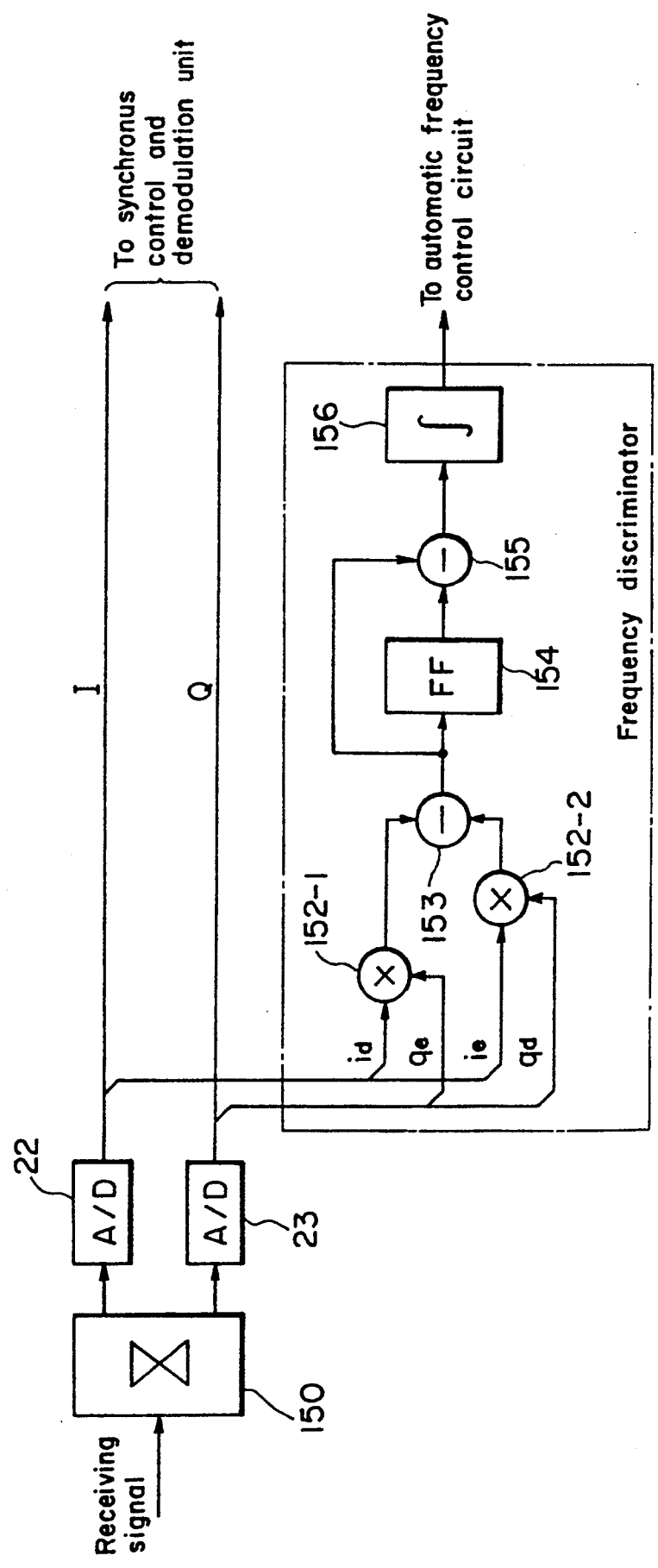
FIG. 22 is a diagram showing a structural example of a conventional frequency discriminator.
Figure 23:
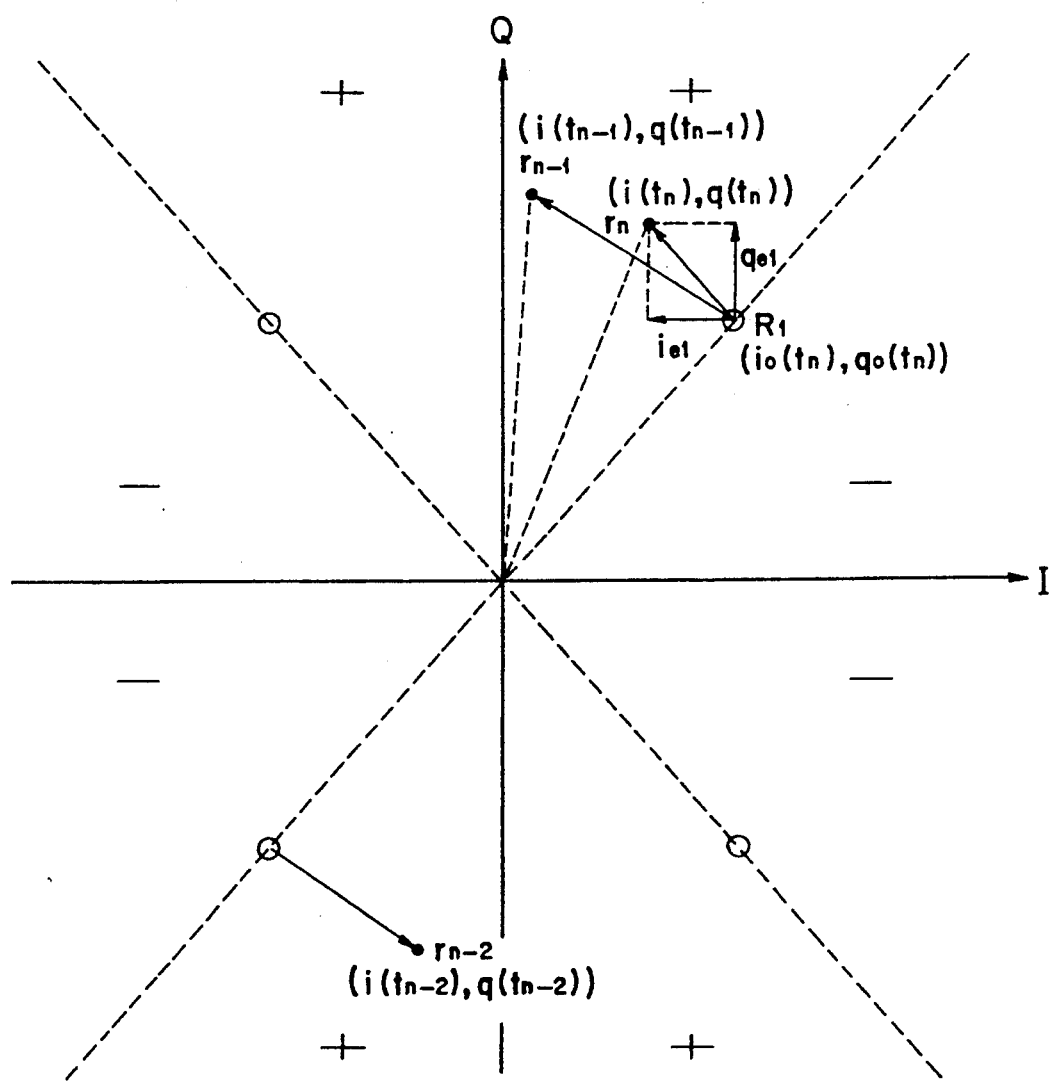
FIG. 23 is an explanatory diagram of the frequency discriminating process.
Figure 24:
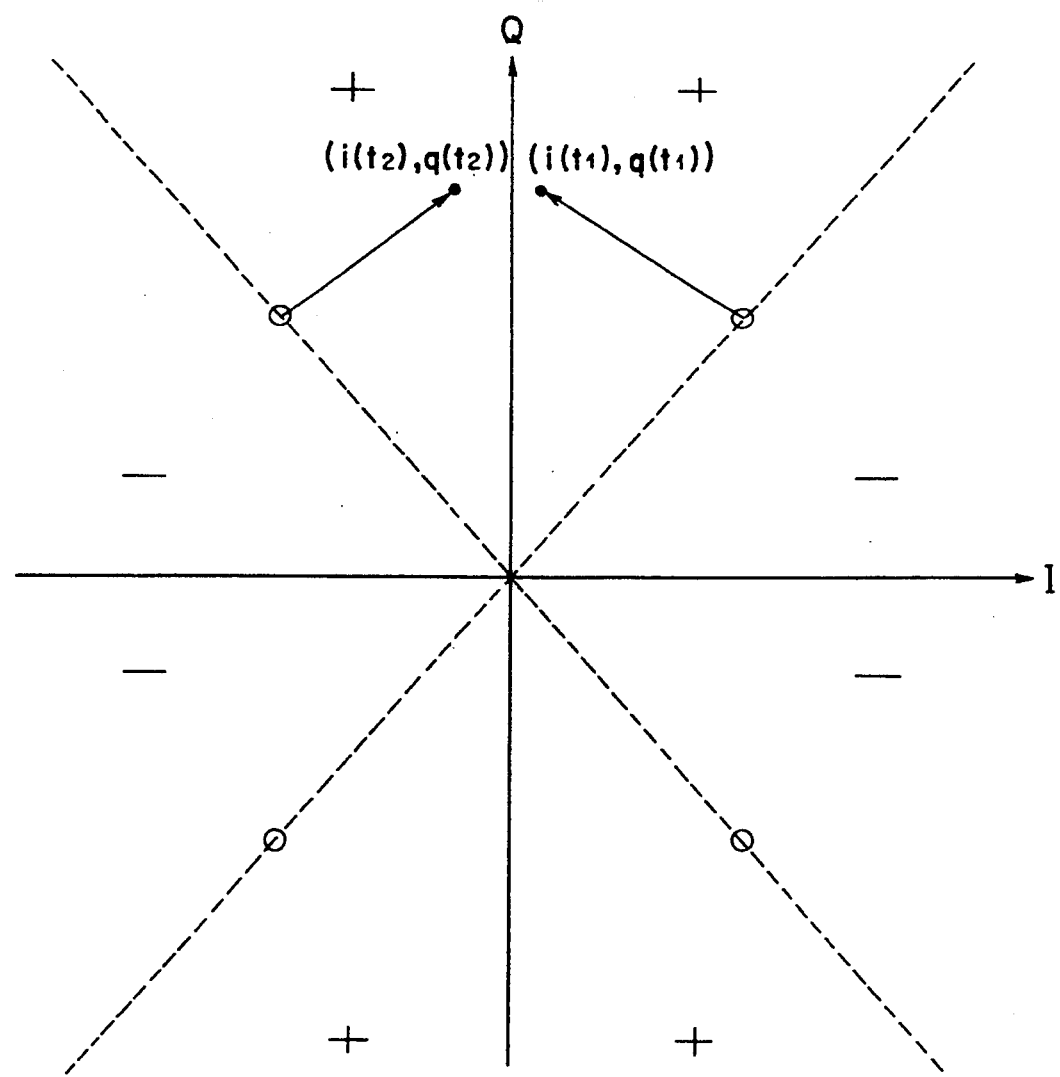
FIG. 24 is a diagram for explaining the disadvantage of the conventional frequency discriminator.

In the Figure, since like reference numerals are attached to the elements having the same functions and structures as those in FIG. 22, an overlapped explanation will be omitted.

The embodiment of the present invention is characterized by a latch circuit (FF) 61 arranged between the output of the subtractor 155 and the input of the integrator 156, a comparator 62 arranged between the output of the subtractor 155 and the clock input of the latch circuit 61 to compare a predetermined threshold value with the output of the comparator 155, and an AND gate 63 for providing the compared result to the clock input thereof in synchronous with the clock CLK.

The multipliers 152-1 and 152-2 and the subtractor 153 constructs the phase error detecting means 311. The phase error detecting means 311 obtains the sign $(i_d, d_e)$ of a coordinate and an error $(i_e, q_e)$ to the coordinate at the normal signal point, from a signal point showing each of symbols in a signal space, the symbols obtained by digital-converting by the A/D converter 22 and 23, and obtains a phase error $\Delta\Theta$ of a reference carrier signal for demodulation with respect to the carrier signal of a quadrature amplitude modulation signal by performing an arithmetic operation according to the expressed $\Delta\Theta = i_d x q_e - i_e x q_d$.

The latch circuit 154 and the subtractor 155 constructs a frequency deviation detecting means 313 which differentiates a phase error $\Delta\Theta$ obtained by the phase error detecting means 311 with a time determining timing for digital conversion to obtain the frequency deviation of the reference carrier wave of a carrier signal.

Moreover, the comparator 62, the AND gate 63, the latch circuit 61 constructs limiting means 315 which limits a frequency deviation obtained by the frequency deviation detecting means 311 to less than an upper limit value in response to the accuracy of the reference carrier signal.

An operation of the present embodiment will be explained below.

The comparator 62 judges the relative relationship in size between the frequency deviation $\Delta f$ and a predetermined threshold value $\Delta F$, the deviation $\Delta F$ obtained by performing an arithmetic operation of the expression (1-2) by the subtractor 155. If $\Delta f < \Delta F$, the AND gate 63 provides a clock CLK to the latch circuit 61. If $\Delta f > \Delta F$, the AND gate 63 prohibits the supply of the clock to the latch circuit 61. The threshold Value $\Delta F$ is the maximum allowable error of a reference carrier frequency for demodulation with respect to the carrier frequency of a received signal.

According to the present embodiment, when the signal point showing a symbol obtained by demodulating a received signal is oppositely separated from the signal point showing a symbol preceding from the symbol by an axis in the signal space, a large error accompanying the phase error shown by the expression (1-1) is detected based on the threshold $\Delta F$, whereby the frequency error (deviation) held in the latch circuit 61 is reserved to update. Therefore a large error can be suppressed in the frequency deviation of the output of the integrator 156 in the conventional embodiment.

Figure 9:
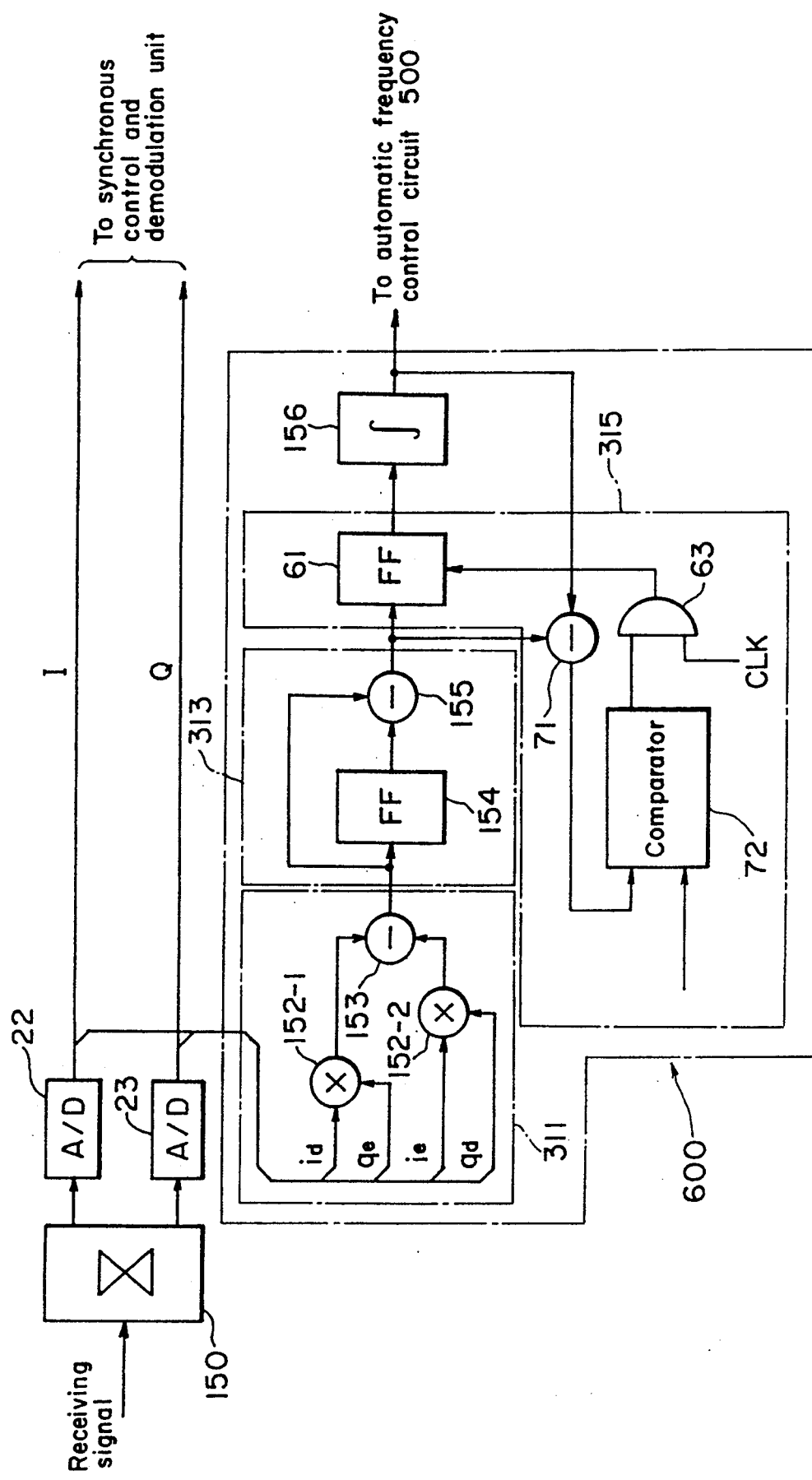
FIG. 9 is a block diagram showing the second concrete example of the main configuration according to the second embodiment of the present invention.

FIG. 9 is a block diagram showing the second embodiment of the main portion of the present embodiment. In the Figure, since like reference numerals are given to elements having the similar functions and structures to those of the embodiment shown in FIG. 8, an overlapped explanation will be omitted.

The present embodiment differs structurally from the embodiment shown in FIG. 8 in that the present embodiment includes a subtractor 71 for obtaining the difference between the frequency deviation at the output of the integrator 156 in accordance with a preceding symbol and the frequency deviation at the output of the subtractor 155 in accordance with the following symbol, and a comparator 72, instead of the comparator 62, for comparing the above difference with the threshold value $\Delta F$.

The subtractor 71, the comparator 72, the AND gate 63, and the latch circuit 61 constructs limiting means 315 which limits a frequency deviation obtained by the frequency deviation detecting means 311 to an upper limit value in accordance with the accuracy of the reference carrier signal. Other elements are similar to the corresponding portions shown in FIG. 8.

In such a frequency discriminator structure, the subtractor 71 calculates a difference between the frequency deviations calculated in accordance with a preceding symbol and the following symbol, and the comparator 72 compares the difference with the threshold value $\Delta F$. When the above difference exceeds the threshold value $\Delta F$, the AND gate 63 restricts a holding operation of the latch circuit 61. As a result, since the frequency deviation at the output of the latch circuit 61 does not include a large error seen in the prior art, the detecting accuracy to the frequency deviation of a reference carrier can be improved.

Figure 10:
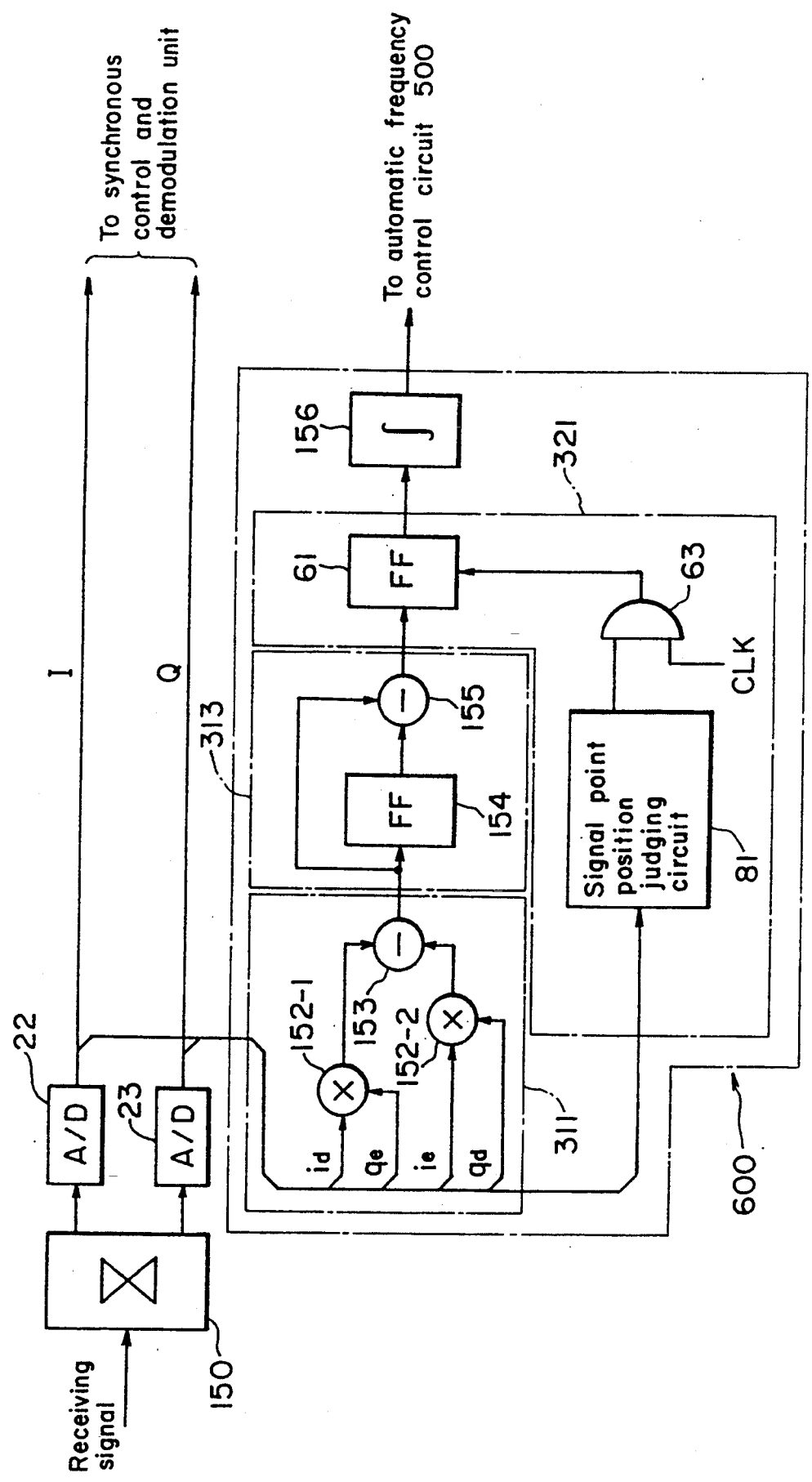
FIG. 10 is a block diagram showing the third concrete example of the main configuration according to the second embodiment of the present invention.

FIG. 10 is a block diagram showing the third embodiment of the main portion in the present embodiment. In the Figure, since like reference numerals are given to elements having the similar functions and structures to those of the embodiments shown in FIGS. 8 and 22, the explanation will be omitted here.

The present embodiment is characterized structurally by a latch circuit (FF) 61 arranged between the output of the subtractor 155 and the input of the integrator 156, a signal point position judging circuit 81 arranged between the output of the A/D converters 22 and 23 and the clock input of the latch circuit 61 to judge the position in the signal space of each signal obtained through demodulation, and an AND gate 63 for providing the judged result to the clock input in synchronous with the clock CLK.

The signal point position Judging circuit 81, the AND gate 63, the latch circuit 61 constructs an output control means 321. The output control means 321 judges based on the coordinates whether the symbol signal points are in a forbidden area or other area, the forbidden area being sandwiched a virtual direct line and the axis, the virtual direct line being rotated bidirectionally and by a predetermined angle round the origin in a signal space, and outputs thinly the frequency deviation obtained by the frequency deviation detecting means in response to the judged result. Other elements are similar to the corresponding elements of the embodiment shown in FIG. 8.

An operation of the above embodiment will be explained below.

Figure 11A:
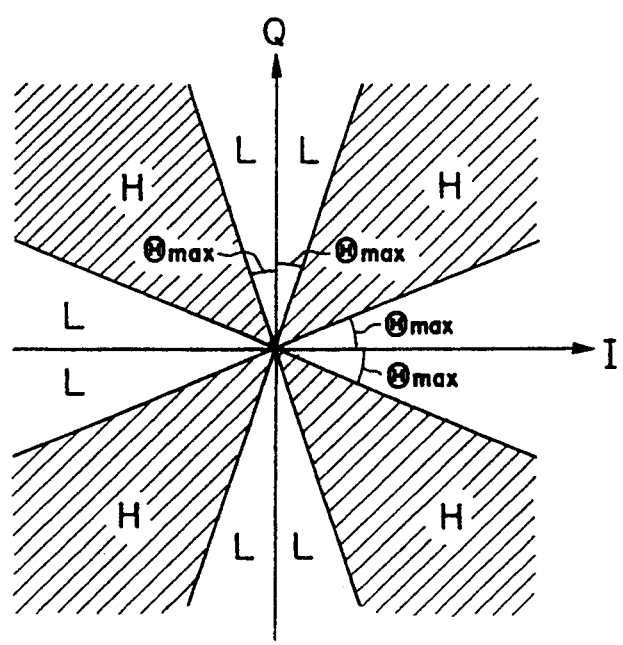
FIGS. 11(a) and 11(b) are a diagram showing the relationship between binary information and signal points set in a table, respectively.

The signal point position judging circuit 81, as shown in FIG. 11(a), stores binary table information in a ROM. The binary information shows whether all possible symbol information to be inputted is positioned in an area or the remaining area, the area being spaced away by more than the maximum allowable value $\Delta\Theta$ of a phase difference from each of axes in a signal space, the phase difference being given previously by the following expression:

$$\Theta_{max} = 2\pi(\Delta F/T) \qquad (3\text{-}1)$$

Furthermore, the signal point position judging circuit 81 refers to the table based on each of symbols from the A/D converters 22 and 23 and the AND gate 63 controls changeably whether the latch circuit 61 latches a phase difference $\Theta(t_n)$ obtained to a new symbol in response to the logical value of a reference result to the table.

In the present embodiment, generally, the above control is executed by utilizing that it is highly probable that the symbol being near to one of axes in the signal space is oppositely spaced away from the preceding symbol arisen from a phase deviation due to an error of a reference carrier frequency by way of an axis. Thus since a phase difference with a large error, like the conventional embodiment, is not inputted to the integrator 156, the detecting accuracy of the frequency deviation of the reference carrier can be improved.

Figure 11B:
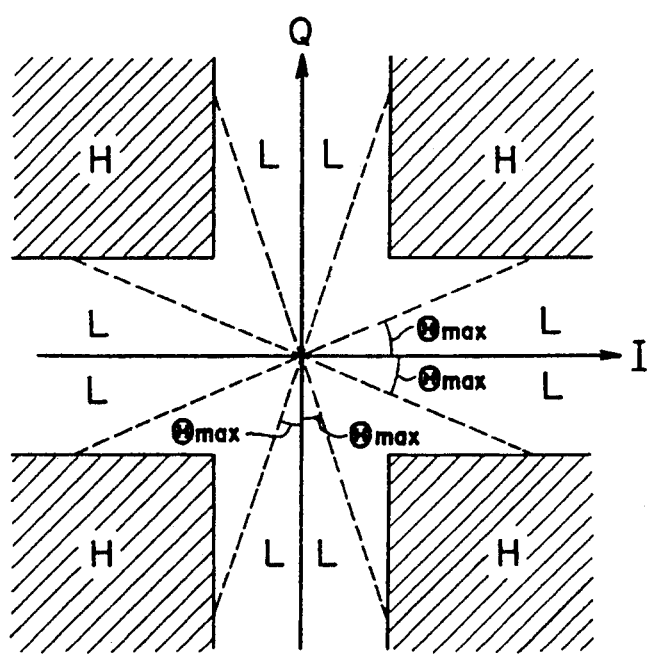

The content of the table, as shown in FIG. 11(b), may be decided based On the boundary defined by connecting points in parallel to each of the axes, without limiting the binary information shown in FIG. 11(a).

FIG. 12 is a block diagram showing the fourth embodiment of the main portion according to the present embodiment. In the Figure, since like numerals is given to elements having similar functions and structures to those of the embodiment in FIG. 8, a duplicate explanation will be omitted here.

The present embodiment differs structurally from the embodiment shown in FIG. 8 in that, instead of the comparator 62, the present embodiment includes an exclusive-OR gate 101 for comparing the sign bit of the output from the subtractor 153 and the sign bit of the output from the latch circuit 154.

The exclusive OR gate 101, the AND gate 63, and the latch circuit 61 constructs an output control means 331. The output control means 331 judges the sign polarity between the phase error $\Delta\ominus$ obtained by the phase error detecting means 311 and the phase error obtained previously to the phase deviation, and outputs thinly the frequency deviation obtained by the frequency deviation detecting means in accordance with the judged result. Other elements are similar to those of the embodiment shown in FIG. 8.

In the frequency discriminator structure, the exclusive-OR gate 101 judges the polarity of the sign bit between the phase difference held in the latch circuit 154 based on the preceding symbol and the phase difference of the output from the subtractor 153 based on the following symbol, and controls the latching operation of the latch circuit 61 by way of the AND gate 63.

Namely, the difference between the compared sign bits means that the preceding symbol is oppositely spaced away from the following symbol by way of an axis in a signal space. Hence since a large error seen in the conventional embodiment does not exist in the frequency deviation inputted in the integrator 156, the detecting accuracy of the frequency deviation of a reference carrier can be improved.

Figure 13:
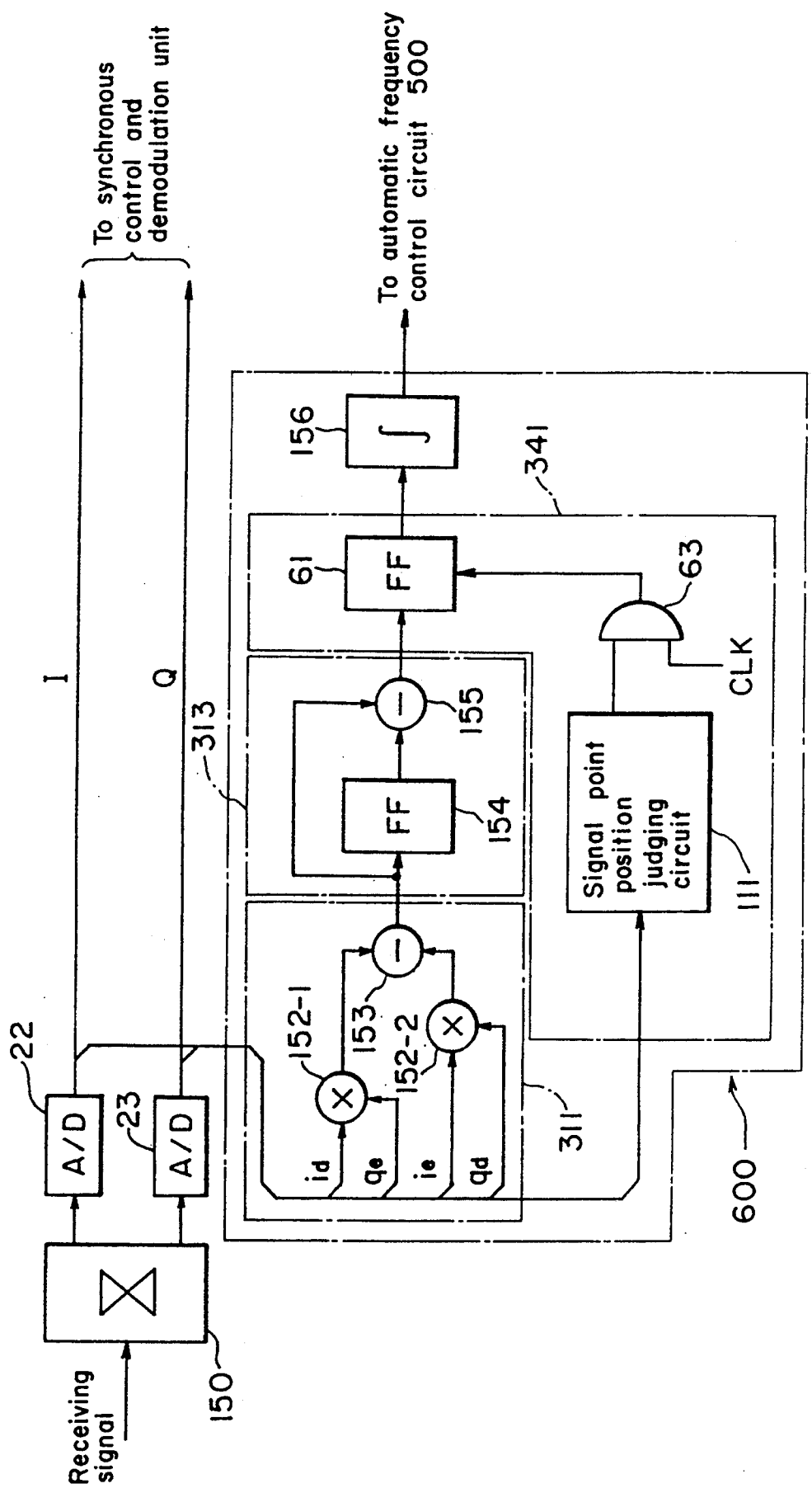
FIG. 13 is a block diagram showing the fifth concrete example of the main configuration of the second embodiment.

FIG. 13 is a block diagram showing the fifth embodiment of the main portion of the present invention. In the Figure, since like numerals are given elements having similar functions and structures to those of the embodiment shown in FIG. 10, the explanation will be omitted here.

The present embodiment differs structurally from the embodiment shown in FIG. 10 in that a signal point position judging circuit 111 includes an internal ROM setting different table content, instead of the signal point position judging circuit 81.

The signal point position judging circuit 111, the AND gate 63, and the latch circuit 61 constructs an output control means 341. The output control means 341 judges whether the signal point of the symbol is in an area showing the allowable range of the phase error $\Delta\ominus$ or other area, the area being near to each of signal points at the same direct distance from the origin, and outputs thinly the frequency deviation obtained the frequency deviation detecting means 313 in accordance with the Judged result. Other elements are similar to those of the embodiment shown in FIG. 10.

The operation of the embodiment will be explained below.

Figure 14A:
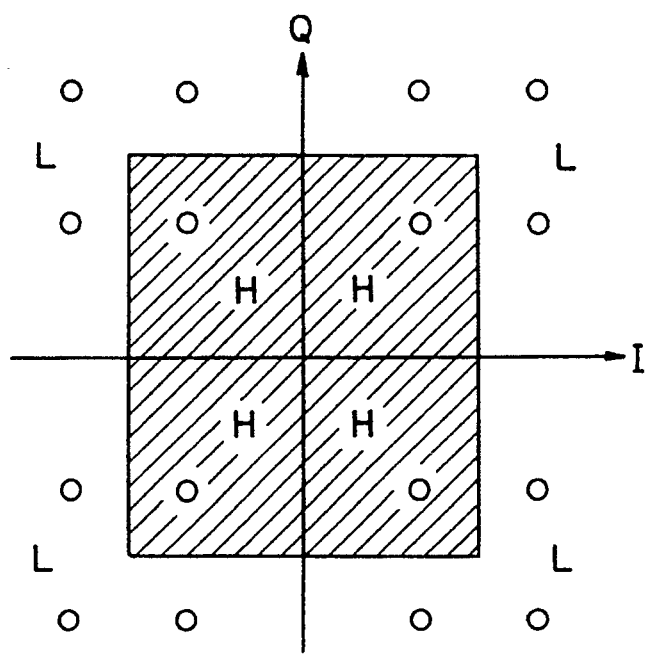
FIGS. 14(a) and 14(b) are diagrams showing the relationship between binary information and signal points set in a table.
Figure 14B:
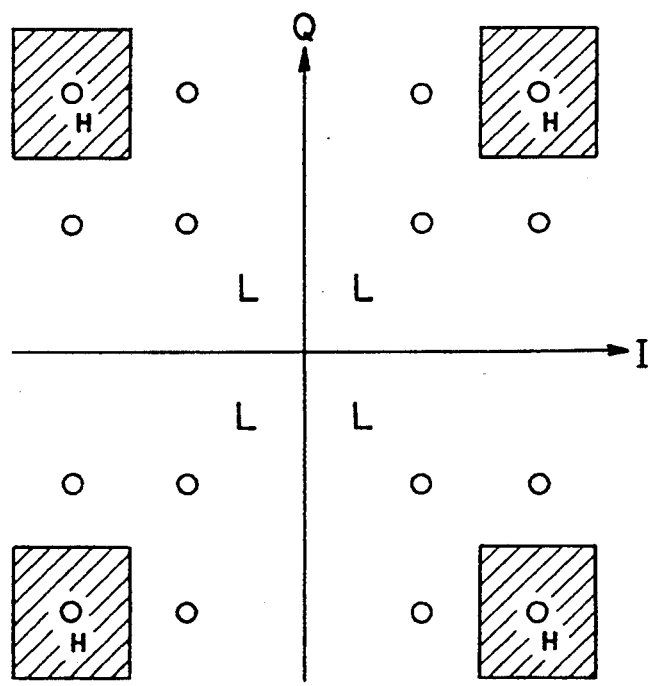

For example, when the receiving signal modulation system is 16QAM, the signal point position judging circuit 111 includes an internal ROM storing one of the two tables shown in FIGS. 14(a) and 14(b). The binary information which identifies areas each covering an area near to a signal point at the same distance from the origin in a signal space and other areas by corresponding to all possible values of each symbol is preset in the tables. The signal point position judging circuit 111 referrs to the above tables in accordance with the symbols of the outputs of the A/D converters 22 and 23 and outputs the binary information showing whether the symbols are at nearly the same direct distance from the origin in the signal space with respect to the preceding symbol. The latching operation of the latch circuit 61 becomes on or off in accordance with the logical value of the binary information.

Therefore, since the direct distance from the origin in a signal space is calculated based on substantially only the same symbols, the frequency deviation of the output of the latch circuit 61 does not include a large error which occurs, as seen in the conventional art, due to an amplitude component of a quadrature modulation wave varied according to the transmission information modulation.

Hence the detecting accuracy of the frequency deviation of a reference carrier wave can be improved.

Figure 15:
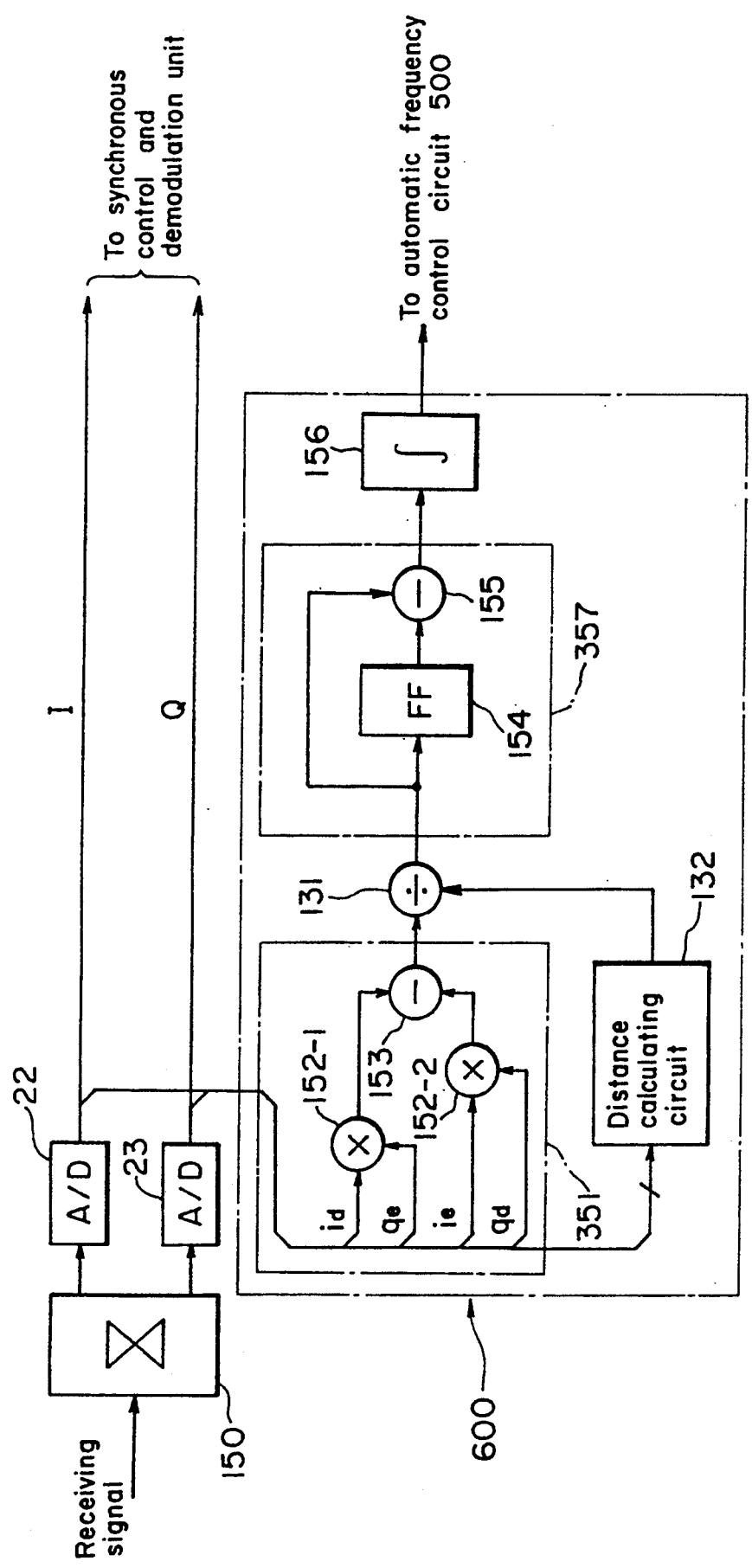
FIG. 15 is a block diagram showing the sixth concrete example of the main configuration of the second embodiment.

FIG. 15 is a block diagram showing the sixth concrete example of the main portion of the present embodiment. In the Figure, since like reference numerals are given to elements having similar functions and structures to those of the embodiment shown in FIG. 22, the explanation will be omitted here.

The structural feature of the present embodiment has in that the divider 131 has its dividend input connected to the output terminal of the subtractor 153 and the distance;calculating circuit 132 is arranged between the outputs of the A/D converters 22 and 23 and the divisor input of the divider 131.

The multipliers 152-1 and 152-2 and the subtractor 153 constructs phase error detecting means 351. The phase error detecting means 351 calculates the signs $(i_d, q_d)$ of the coordinate and the error $(i_e, q_e)$ to the coordinate at the normal signal point from the coordinate of the signal point showing the symbol in the signal space in each of symbols, the symbols being obtained by digital-converting by the A/D converters 22 and 23, and obtains the phase error $\Delta\ominus$ of a reference carrier signal of the demodulation to the quadrature amplitude modulated wave carrier wave by performing an arithmetic operation of the expression $\Delta\ominus = (i_d \times q_e) - (i_e \times q_d)$.

The distance calculating circuit 132 corresponds to amplitude component calculating means for obtaining the direct distance of the coordinate from the origin in the signal space in accordance with the coordinate. The divider 131 corresponds to normalizing means for dividing the phase error $\Delta\ominus$ obtained by the phase error detecting means 351 by the direct distance obtained by the amplitude component calculating means and for normalizing the phase error with the direct distance.

The latch circuit 154 and the subtractor 155 corresponds to frequency deviation detecting means 357 which differentiates the phase error normalized by the normalizing means with a time determining timing for the digital conversion and obtains the frequency deviation of the reference carrier signal with respect to the carrier signal.

The operation of the embodiment will be explained below.

In order to obtain the distance $I_k$ between the point (or coordinate $(i(t_k), q(t_k))$) of each symbol in the signal space and the origin thereof, the distance calculating circuit 132 performs an arithmetic operation using the following approximate expression:

$$I_k = (i^2(t_k) + q^2(t_k))^{\frac{1}{2}}$$

or $$I_k \approx i(t_k) + q(t_k)$$

where $k = 1, 2, \ldots n$. The divider 131 divides the phase difference $\theta(t_k)$ of the output of the subtractor 153 with the distance $I_k$.

Figure 16:
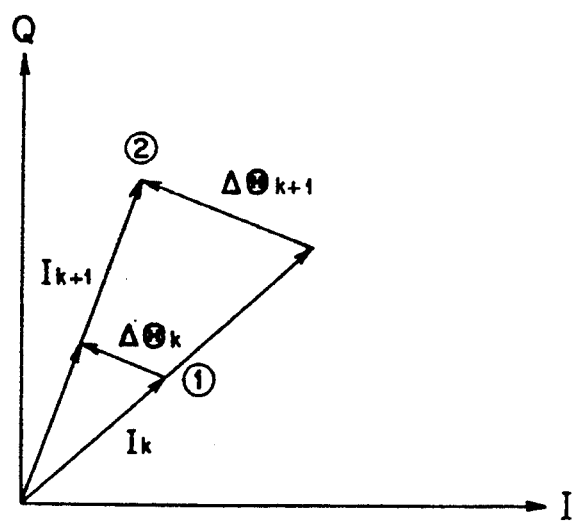
FIG. 16 is an explanatory diagram of a phase difference error suppressing process.
Figure 17:
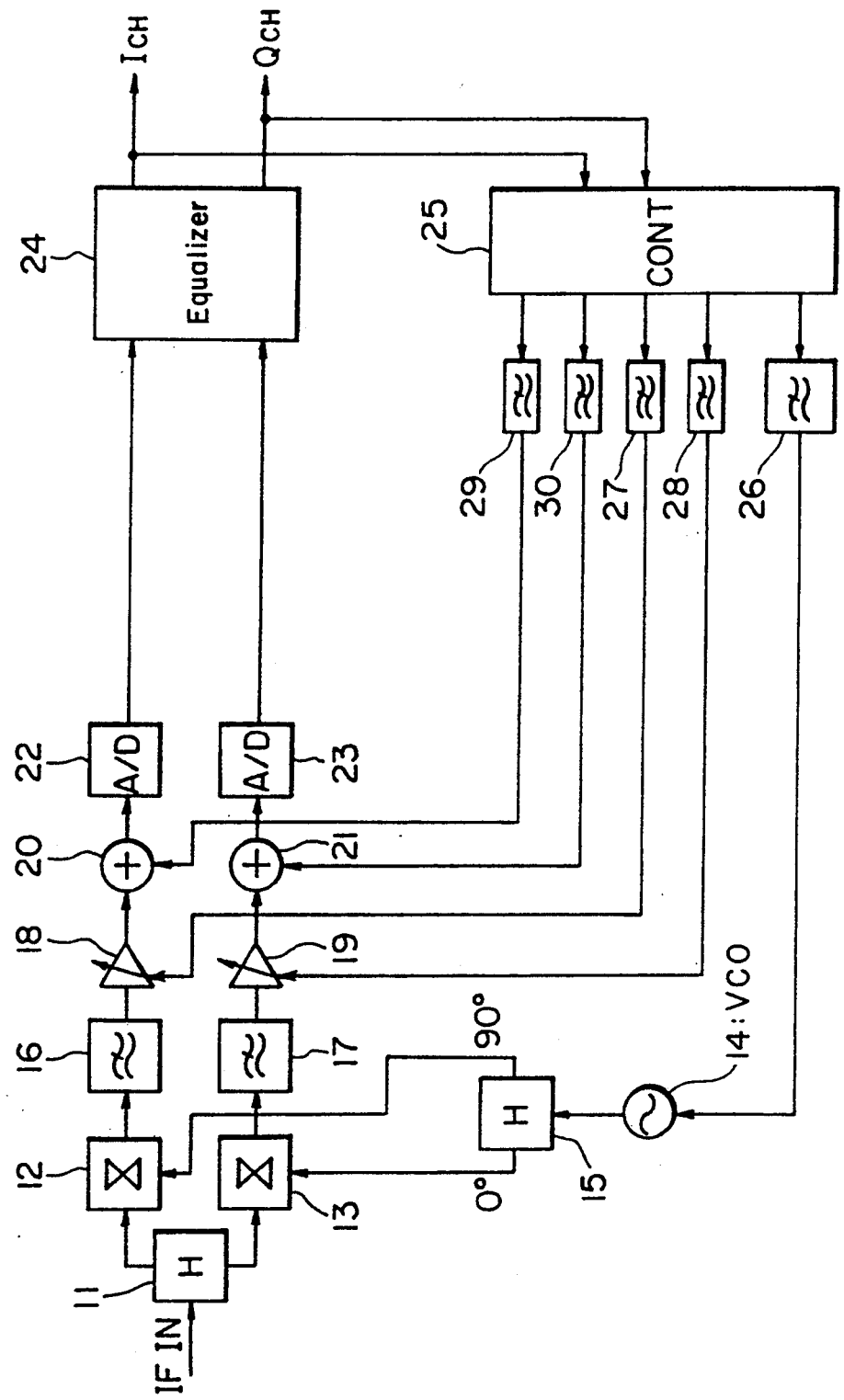
FIG. 17 is a block diagram showing a synchronous detection and demodulation circuit.
Figure 18:
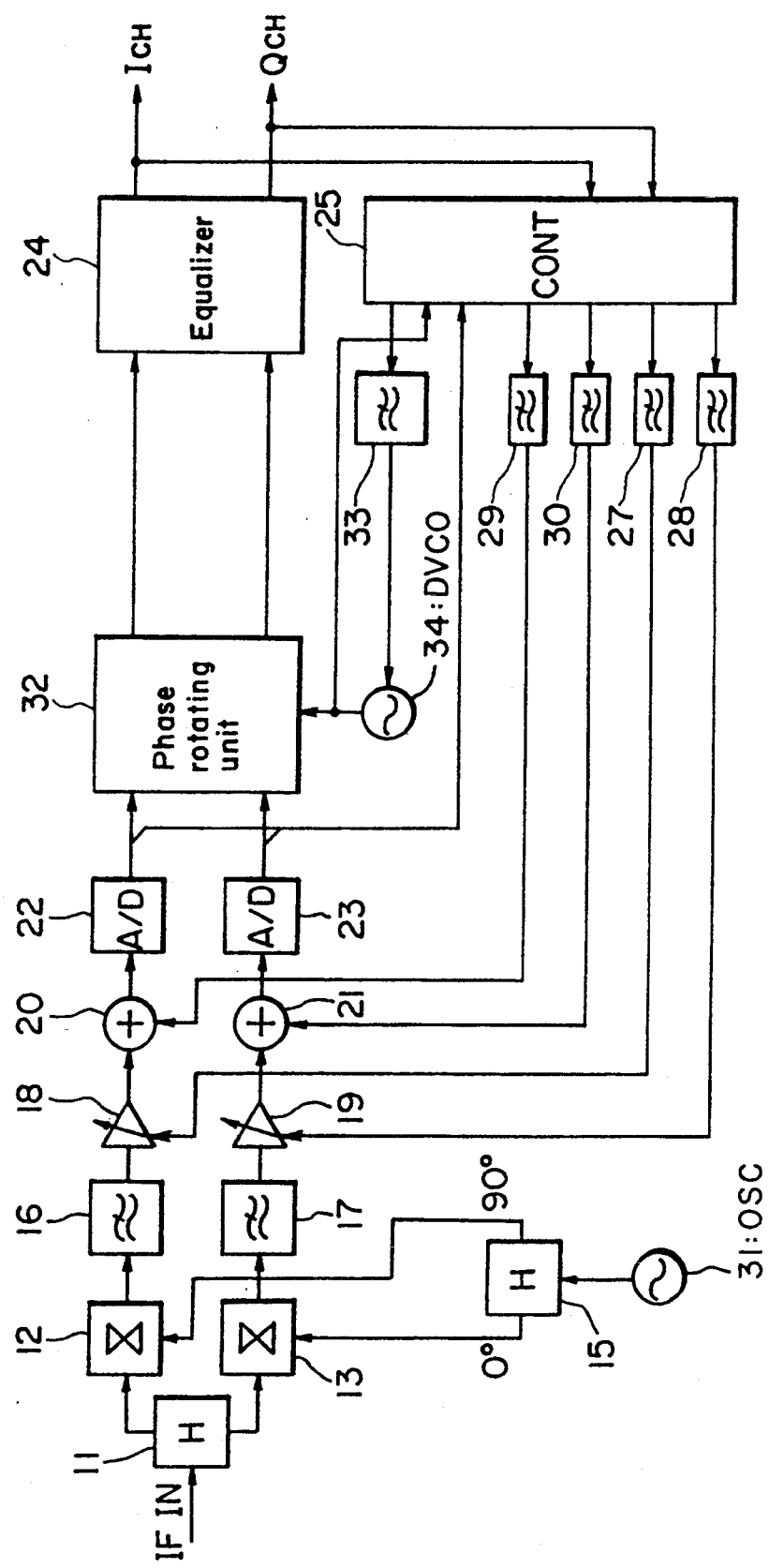
FIG. 18 is a block diagram showing a quasi-synchronous detection and demodulation circuit.
Figure 19:
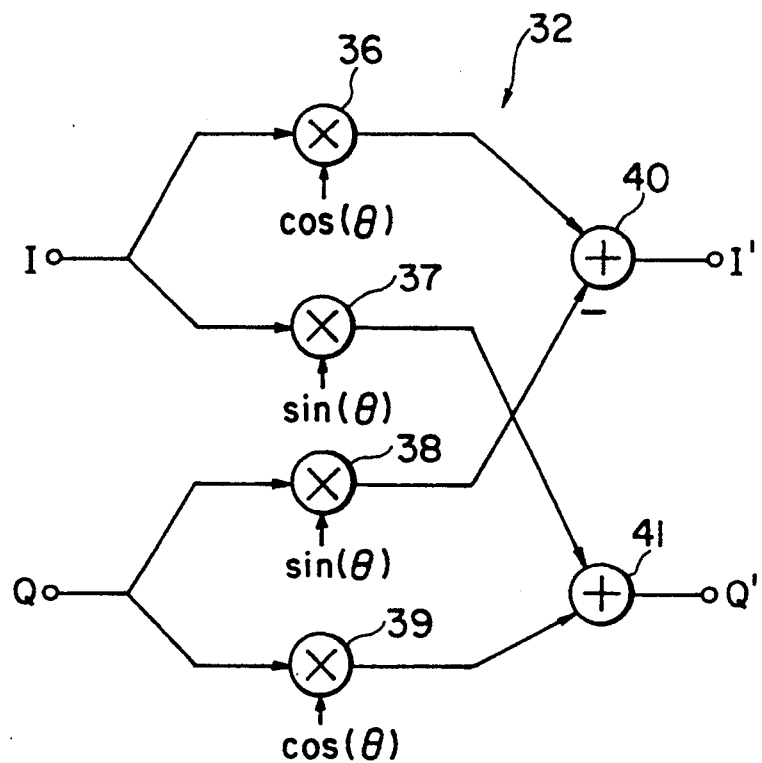
FIG. 19 is a diagram showing the configuration of a phase rotation unit.
Figure 20:
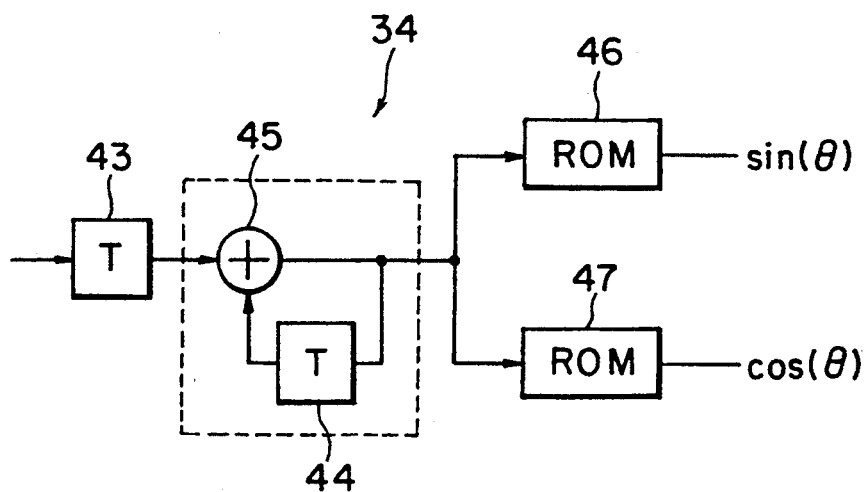
FIG. 20 is a diagram showing a DVCO structure.
Figure 21:
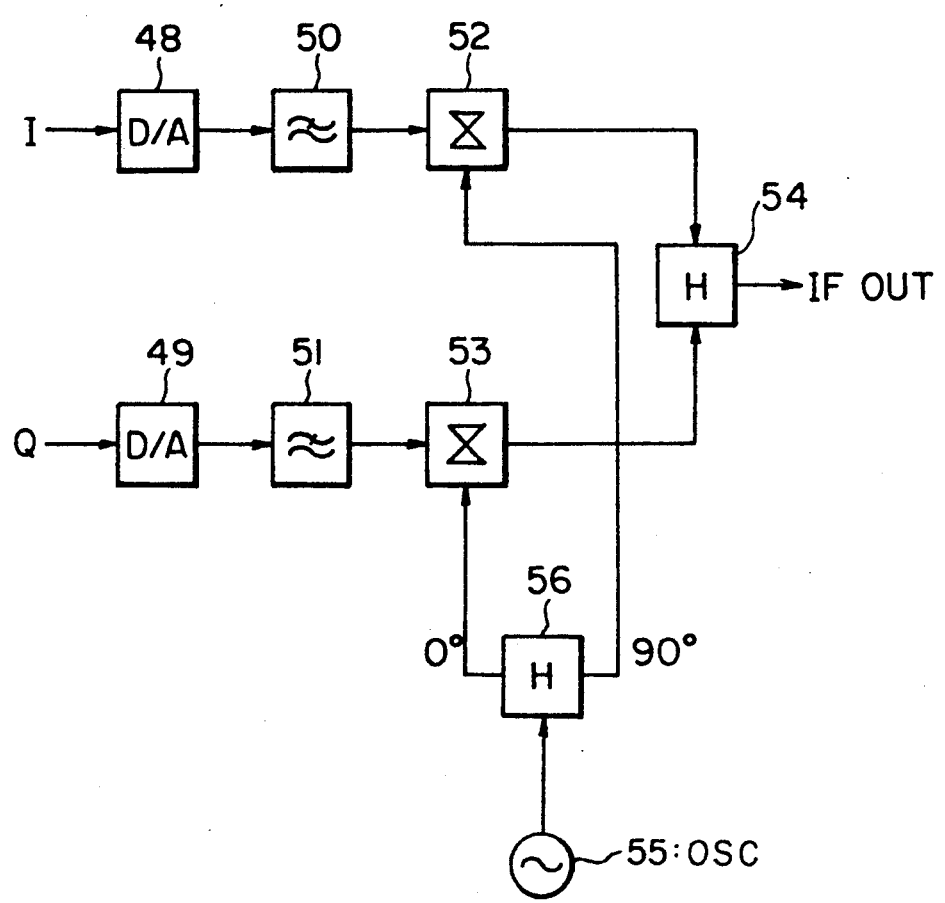
FIG. 21 is a diagram showing a rough structure example on the modulation side.

Namely, when the following symbol (shown with (2) in FIG. 16) is added to the preceding symbol (shown with (1) in FIG. 16) while the amplitude of a receiving signal for each symbol varies from $I_k$ to $I_{k+1}$ in accordance with transmission information, the following proportional expression is generally held with respect to the phases $\Delta\Theta(t_k)$ ans $\Delta\Theta(t_{k+1})$ of the carriers wave corresponding to the symbols:

$$\Delta\Theta(t_k)/I_k = (\Delta\Theta t_{k+1})/I_{k+1}$$

However, since the variation is absorbed by normalizing with the direct distance from the origin in the signal space, provided that the carriers of the symbols are the same in phase, a large error, as seen in the conventional art, does not occur between the phase difference $\Delta\Theta(t_k)$ and $\Delta\Theta(t_{k+1})$, whereby the detecting accuracy to the frequency of a reference carrier wave can be improved.

In each concrete example in the second embodiment, it is restricted that a frequency deviation corresponding to an error produced in the conventional example is held by the latch circuit 61, and a previously held value is provided to the automatic frequency control circuit 500, instead of the frequency deviation under the restriction. However, the present invention should not be limited to the above method. For example, in order to restrict previously the frequency deviation from the subtractor 155 to less than an upper limit value and to provide a new frequency deviation to the automatic frequency control circuit 500, when a strobe signal is used for the deviation capture timing, the method for limiting an active state due to the strobe signal may be used.

What is claimed is:

1. A quasi-synchronous detection and demodulation device, comprising:
   quadrature detection means for performing a quasi-synchronous detection of a quadrature amplitude modulation signal and for issuing two series of quadrature detection signals;
   phase rotating means for rotating in phase said quadrature detection signals from said quadrature detection means to issue two series of demodulation signals with no rotation;
   carrier generating means for providing an output carrier signal having phase rotation information to said phase rotating means;
   frame-pattern detecting means for detecting a frame-pattern with two series of demodulation signals from said phase rotating means; and
   carrier phase compensating means for compensating an output carrier phase from said carrier generating means added to said phase rotating means to detect a normal frame pattern by means of said frame pattern detecting means.

2. A quasi-synchronous detection and demodulation device according to claim 1, wherein said carrier generating means accumulates as an address an error signal based on a phase error from said phase rotation means and transmits data value read from a memory as an output carrier signal; and wherein said carrier phase compensating means adds sequentially an output carrier phase of 0, $\pi/2$, $\pi$, and $3\pi/2$ to said address value accumulated to fix an added address value of said normal frame pattern detected by said frame pattern detecting means.

3. A quasi-synchronous detection and demodulation device according to claim 2, wherein said carrier generating means comprises:
   error signal detecting means for detecting an error signal based on a phase error from said phase rotating means;
   error signal accumulating means for accumulating said error signal detected by said error signal detecting means to make an address; and
   a memory for reading data based on said address from said error signal accumulating means to issue it to as an output carrier signal; and
   said carrier phase compensating means comprises:
   a judging means for Judging whether said frame-pattern detecting means has detected a normal frame-pattern;
   a base-4 counter for issuing sequentially an output carrier phase of 0, $\pi/2$, $\pi$, and $3\pi/2$ and for fixing said output when said judging means judges that said frame-pattern detecting means has detected said normal frame pattern; and
   adding means for adding an output from said base-4 counter to said address accumulated.

4. A quasi-synchronous detection and demodulation device according to claim 1, wherein said carrier generating means accumulates as an address an error signal based on a phase signal from said phase rotating means and issues data read from a memory as an output carrier signal; and wherein said carrier phase compensating means continues to add an address to said accumulated error signal, said address to which an output carrier phase is added to $\pi/2$, till said frame-pattern detecting means detects a normal frame-pattern.

5. A quasi-synchronous detection and demodulation device according to claim 4, wherein said carrier generating means comprises:
   error signal detecting means for detecting an error signal based on a phase error from said phase rotating means;
   error signal accumulating means for accumulating said error signal detected by said error signal detecting means to make an address; and
   a memory for reading a data value based on said address from said error signal accumulating means and for issuing it as an output carrier signal; and
   said carrier phase compensating means comprises:
   a judging means for judging whether said frame-pattern detecting means has detected a normal frame-pattern;

π/2 address generating means for issuing an address value to which an output carrier phase is added by π/2 till said judging means detects a normal frame pattern by means of said frame pattern detecting means; and adding means for adding the output from said π/2 address generating means to said accumulated error signal.

6. A quasi-synchronous detection and demodulation device according to claim 1, wherein said carrier generating means accumulates as an address an error signal based on a phase error from said phase rotating means and issues a data value read out from a memory as an output carrier signal; and wherein said carrier phase compensating means detects a contingent phase difference from a frame-pattern detected by means of said frame-pattern detecting means and adds an address value corresponding to a detected phase difference to said accumulated address value.

7. A quasi-synchronous detection and demodulation device according to claim 6, wherein said carrier generating means comprises:

error signal detecting means for detecting an error signal based on a phase error from said phase rotating means;

error signal accumulating means for accumulating said error signal detected by said error signal detecting means to make an address; and a memory for reading a data value based on said address from said error signal accumulating means and for issuing it as an output carrier signal; and said carrier phase compensating means comprises:

a contingent phase difference detecting means for detecting a contingent phase difference according to a frame pattern detected by means of said frame pattern detecting means;

address value generating means for generating an address value corresponding to a phase difference detected by means of said contingent phase difference detecting means; and adding means for adding an address value generated from said address generating means to said accumulated address.

* * * * *